(12) United States Patent
Kanamori et al.

(10) Patent No.: US 12,733,163 B2
(45) Date of Patent: Sep. 8, 2026

(54) THREE-DIMENSIONAL NONVOLATILE MEMORY DEVICE INCLUDING A PLURALITY OF MEMORY CELLS

(71) Applicant: SAMSUNG ELECTRONICS CO., LTD., Suwon-si (KR)

(72) Inventors: Kohji Kanamori, Suwon-Si (KR); Jeehoon Han, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 265 days.

(21) Appl. No.: 18/586,624

(22) Filed: Feb. 26, 2024

(65) Prior Publication Data

US 2024/0292613 A1 Aug. 29, 2024

(30) Foreign Application Priority Data

Feb. 28, 2023 (KR) ........................ 10-2023-0026908

(51) Int. Cl.
*H10B 20/10* (2023.01)
*H10B 43/20* (2023.01)
*H10D 62/10* (2025.01)
*H10D 62/40* (2025.01)

(52) U.S. Cl.
CPC ........... *H10B 43/20* (2023.02); *H10D 62/127* (2025.01); *H10D 62/405* (2025.01)

(58) Field of Classification Search
CPC ........ H10B 43/20; H10B 43/10; H10B 43/27; H10B 43/30; H10D 62/127; H10D 62/405
USPC .......................................................... 257/288
See application file for complete search history.

(56) References Cited

U.S. PATENT DOCUMENTS 8,187,936 B2 5/2012 Alsmeier et al.
8,236,673 B2 8/2012 Son et al.
9,318,329 B2 4/2016 Kohji et al.
9,431,409 B2 * 8/2016 Lee ........................ H10B 41/20
(Continued)

OTHER PUBLICATIONS

C.F. Cheng, et al., "Modeling of Grain Growth Mechanism by Nickel Silicide Reactive Grain Boundary effect in Metal-Induced-Lateral-Crystallization", IEEE Transactions on Electronic Devices, vol. 50, No. 6, Jun. 2003, pp. 1467-1474.

*Primary Examiner* — Theresa T Doan
(74) *Attorney, Agent, or Firm* — Morgan, Lewis & Bockius LLP

(57) ABSTRACT

A three-dimensional nonvolatile memory device includes: a plurality of insulating layers stacked on a substrate in a vertical direction substantially perpendicular to a surface of the substrate; a plurality of channel layers positioned between the plurality of insulating layers, and elongated in a first horizontal direction that is parallel to the surface of the substrate, wherein the plurality of channel layers includes a first metal element; a diffusion stop layer conformally formed in a trench passing through the plurality of insulating layers and the plurality of channel layers in the vertical direction; and a crystalline semiconductor pattern between each of the plurality of channel layers and the diffusion stop layer, wherein the crystalline semiconductor pattern includes a second metal element, wherein a concentration of the second metal element in the crystalline semiconductor pattern is higher than a concentration of the first metal element in the plurality of channel layers.

20 Claims, 30 Drawing Sheets

(56) References Cited

U.S. PATENT DOCUMENTS

| | | | | |
|---|---|---|---|---|
| 10,283,522 | B2 * | 5/2019 | Zushi .................. | H10D 62/115 |
| 10,572,380 | B2 | 2/2020 | Li et al. | |

* cited by examiner

THREE-DIMENSIONAL NONVOLATILE MEMORY DEVICE INCLUDING A PLURALITY OF MEMORY CELLS

CROSS-REFERENCE TO RELATED APPLICATION

This application claims priority under 35 U.S.C. § 119 to Korean Patent Application No. 10-2023-0026908, filed on Feb. 28, 2023, in the Korean Intellectual Property Office, the disclosure of which is incorporated by reference herein in its entirety.

TECHNICAL FIELD

The present inventive concept relates to a nonvolatile memory device, and more particularly, to a three-dimensional nonvolatile memory device including a plurality of memory cells repeatedly arranged in three dimensions.

DISCUSSION OF THE RELATED ART

Down-scaling of semiconductor devices has rapidly advanced due to the development of electronic technology, and a high degree of integration of semiconductor devices is desired to increase the storage capacity of semiconductor memory devices used in electronic devices. For example, three-dimensional nonvolatile memory devices have been under development to have a structure that is capable of securing desired reliability for memory cells even when the number of vertically overlapping memory cells stacked on a substrate of a three-dimensional nonvolatile memory device increases.

SUMMARY

According to an embodiment of the present inventive concept, a three-dimensional nonvolatile memory device includes: a plurality of insulating layers stacked on a substrate in a vertical direction substantially perpendicular to a main surface of the substrate; a plurality of channel layers positioned between the plurality of insulating layers, and elongated in a first horizontal direction that is parallel to the main surface of the substrate, wherein the plurality of channel layers includes a first metal element; a diffusion stop layer conformally formed in a trench passing through the plurality of insulating layers and the plurality of channel layers in the vertical direction; and a crystalline semiconductor pattern between each of the plurality of channel layers and the diffusion stop layer, wherein the crystalline semiconductor pattern includes a second metal element, wherein a concentration of the second metal element in the crystalline semiconductor pattern is higher than a concentration of the first metal element in the plurality of channel layers.

According to an embodiment of the present inventive concept, a three-dimensional nonvolatile memory device includes: a first cell array, a second cell array, and a third cell array each including a plurality of insulating layers and a plurality of channel layers alternately stacked on a substrate in a vertical direction substantially perpendicular to a main surface of the substrate, wherein the first to third cell arrays are spaced apart from each other in a first horizontal direction that is parallel to the main surface of the substrate and crosses the vertical direction; a diffusion stop layer conformally formed in a first trench between the first cell array and the second cell array, wherein the first trench passes through the plurality of insulating layers and the plurality of channel layers in the vertical direction; a first slit insulating layer filling the first trench, on the diffusion stop layer; and a first crystalline semiconductor pattern disposed between each of the plurality of channel layers and the diffusion stop layer, wherein the first crystalline semiconductor pattern includes a first metal element, wherein the plurality of channel layers include the first metal element, wherein the first crystalline semiconductor pattern includes a second metal element, wherein a concentration of the second metal element in the first crystalline semiconductor pattern is higher than a concentration of the first metal element in the plurality of channel layers.

According to an embodiment of the present inventive concept, a three-dimensional nonvolatile memory device includes: a first cell array, a second cell array, and a third cell array each including a plurality of insulating layers and a plurality of channel layers alternately stacked on a substrate in a vertical direction substantially perpendicular to a main surface of the substrate, wherein the first to third cell arrays are spaced apart from each other in a first horizontal direction that is parallel to the main surface of the substrate and crosses the vertical direction; a vertical word line structure passing through some of the plurality of channel layers in the vertical direction and connected to the plurality of channel layers; a diffusion stop layer conformally formed in a first trench between the first cell array and the second cell array, wherein the first trench passes through the plurality of insulating layers and the plurality of channel layers in the vertical direction; a first slit insulating layer filling the first trench, on the diffusion stop layer; and a first crystalline semiconductor pattern disposed between each of the plurality of channel layers and the diffusion stop layer, wherein the first crystalline semiconductor pattern includes a first metal element, wherein the plurality of channel layers each include a second metal element, the first metal element and the second metal element are identical elements, and a concentration of the second metal element in the plurality of channel layers is higher than a concentration of the first metal element in the first crystalline semiconductor pattern.

BRIEF DESCRIPTION OF THE DRAWINGS

The above and other aspects of the present inventive concept will become more apparent by describing in detail embodiments thereof, with reference to the accompanying drawings, in which.

DETAILED DESCRIPTION OF THE EMBODIMENTS

Hereinafter, embodiments will be described in detail with reference to the accompanying drawings. However, the present inventive concept should not be limited to the embodiments described below and may be embodied in various other forms.

Figure 1:
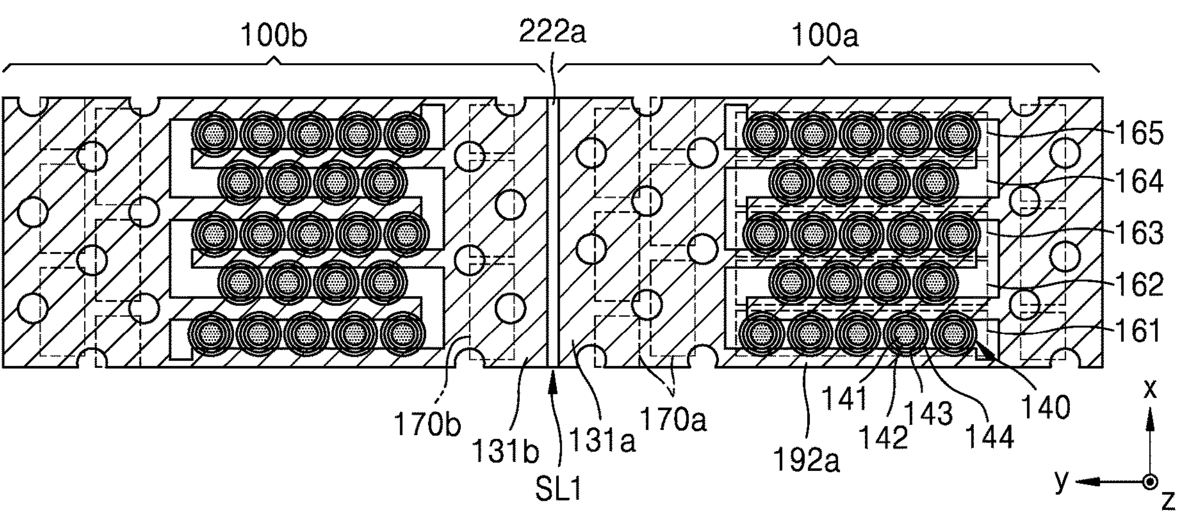
FIG. 1 is a partial plan view of a memory cell array of a three-dimensional nonvolatile memory device, according to an embodiment of the present inventive concept.
Figure 2:
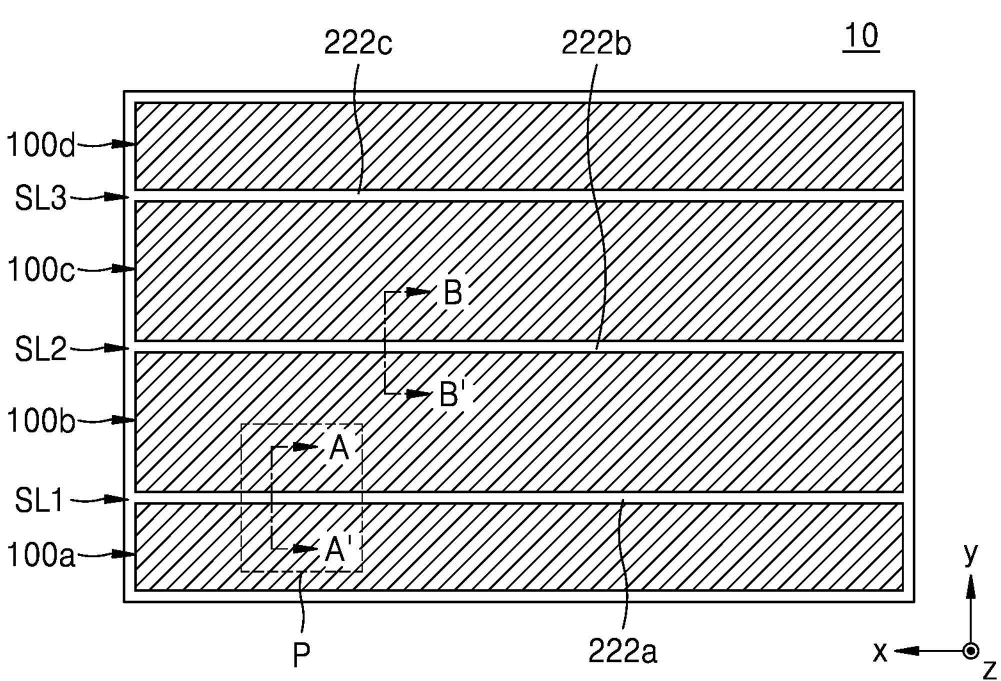
FIG. 2 is a plan view of a three-dimensional nonvolatile memory device according to an embodiment of the present inventive concept.

FIG. 1 is a partial plan view of a memory cell array of a three-dimensional nonvolatile memory device, according to an embodiment of the present inventive concept. FIG. 2 is a plan view of a three-dimensional nonvolatile memory device 10 according to an embodiment of the present inventive concept.

Referring to FIGS. 1 and 2, a first horizontal direction (e.g., an X-direction) and a second horizontal direction (e.g., a Y-direction) may be directions that cross each other. For example, the first horizontal direction (e.g., the X-direction) and the second horizontal direction (e.g., the Y-direction) may be directions substantially perpendicular to each other. A vertical direction (e.g., a Z-direction) may be a direction crossing both the first horizontal direction (e.g., the X-direction) and the second horizontal direction (e.g., the Y-direction). For example, the vertical direction (e.g., the Z-direction) may be a direction substantially perpendicular to the first horizontal direction (e.g., the X-direction) and the second horizontal direction (e.g., the Y-direction). Accordingly, the first horizontal direction (e.g., the X-direction), the second horizontal direction (e.g., the Y-direction), and the vertical direction (e.g., the Z-direction) may be orthogonal to each other.

The three-dimensional nonvolatile memory device 10 according to an embodiment of the present inventive concept may include a plurality of MCAs 100*a*, 100*b*, 100*c*, and 100*d*. The plurality of MCAs 100*a*, 100*b*, 100*c*, and 100*d* may include a first MCA 100*a*, a second MCA 100*b*, a third MCA 100*c*, and a fourth MCA 100*d*, which are spaced apart from each other in the second horizontal direction (e.g., the Y-direction). Each of the MCAs 100*a*, 100*b*, 100*c*, and 100*d* may include a plurality of memory cell strings 161, 162, 163, 164, and 165 elongated on the substrate 102 in the second horizontal direction (e.g., the Y-direction) parallel to a main surface 102M of a substrate 102 (see FIG. 5). The plurality of memory cell strings 161, 162, 163, 164, and 165 may each be parallel to the main surface of the substrate and may be repeatedly arranged in the second horizontal direction (e.g., the Y-direction) orthogonal to the first horizontal direction (e.g., the X-direction) and the vertical direction (e.g., the Z-direction) that is substantially perpendicular to the main surface 102M of the substrate 102 (see FIG. 4). However, the present inventive concept is not limited thereto. For example, the plurality of memory cell strings 161, 162, 163, 164, and 165 may be repeatedly arranged in the first horizontal direction (e.g., the X-direction).

As shown in FIG. 1, the first MCA 100*a* and the second MCA 100*b* may include a plurality of bit line pad stacks 131*a* and 131*b* arranged to at least partially surround the plurality of memory cell strings 161, 162, 163, 164, and 165, respectively. A first bit line pad stack 131*a* may be arranged outside the first MCA 100*a*, and a second bit line pad stack 131*b* may be arranged outside the second MCA 100*b*. The first and second MCAs 100*a* and 100*b* may include a plurality of first and second bit line pads 170*a* and 170*b* arranged on one side of the plurality of memory cell strings 161, 162, 163, 164, and 165, respectively. The plurality of first and second bit line pads 170*a* and 170*b* may be arranged to overlap each other at positions spaced apart from each other in the vertical direction (e.g., the Z-direction).

Each of the plurality of MCAs 100*a* and 100*b* shown in FIG. 1 may include a plurality of horizontal channel layers 192*a* and a plurality of vertical word line structures 140. The plurality of horizontal channel layers 192*a* may have a planar shape elongated in the second horizontal direction (e.g., the Y-direction), and the plurality of vertical word line structures 140 may be disposed between the plurality of channel layers 192*a* and may pass through at least some of the plurality of channel layers 192*a*.

Each of the vertical word line structures 140 may include a word line 141, a blocking insulating layer 142, a charge trap layer 143, and a tunnel insulating layer 144. The word line 141 may be elongated in the vertical direction (e.g., the Z-direction), and the blocking insulating layer 142 may at least partially surround the word line 141. Each of the blocking insulating layer 142, the charge trap layer 143, and the tunnel insulating layer 144 may have an annular shape when viewed from a plane (e.g., an X-Y plane). The blocking insulating layer 142 may be disposed between a vertical word line structure 140 and a horizontal channel layer 192*a*.

The tunnel insulating layer 144 may be arranged to at least partially surround the outer surface of the vertical word line structure 140 along the circumference of the vertical word line structure 140, and be in contact with the outer surface of the vertical word line structure 140. The blocking insulating layer 142 may have a cylindrical shape elongated in the vertical direction (e.g., the Z-direction) while surrounding the vertical word line structure 140. The charge trap layer 143 may be arranged on the same vertical level as the plurality of horizontal channel layers 192*a* on the substrate 102 (see FIG. 5). The tunnel insulating layer 144 may be disposed between the charge trap layer 143 and the horizontal channel layer 192*a*.

In some embodiments of the present inventive concept, the blocking insulating layer 142 may include metal oxide. For example, the charge trap layer 143 may include silicon nitride, and the tunnel insulating layer 144 may include silicon oxide. In the present embodiment, the tunnel insulating layer 144 may provide a path for electrons to tunnel to or from the charge trap layer 143. The blocking insulating layer 142 may block electrons from tunneling or leaking from the charge trap layer 143 to the word line 141.

Each of a plurality of word lines 141 may include, for example, a metal, conductive metal nitride, a conductive semiconductor material, or a combination thereof. In some embodiments of the present inventive concept, the plurality of vertical word line structure 140 may include tungsten (W), aluminum (Al), copper (Cu), cobalt (Co), molybdenum (Mo), titanium (Ti), tantalum (Ta), titanium nitride (TiN), tantalum nitride (TaN), tungsten nitride (WN), tungsten carbon nitride (WCN), titanium silicon nitride (TiSiN), tantalum silicon nitride (TaSiN), tungsten silicon nitride (WSiN), or a combination thereof, but the present inventive concept is not limited thereto. The plurality of first and second bit line pads 170*a* and 170*b* may include doped polysilicon. In some embodiments of the present inventive concept, the plurality of first and second bit line pads 170*a* and 170*b* may include polysilicon doped with an n-type dopant. The n-type dopant may include at least one of, for example, phosphorus (P), arsenic (As), and/or antimony (Sb).

Figure 3:
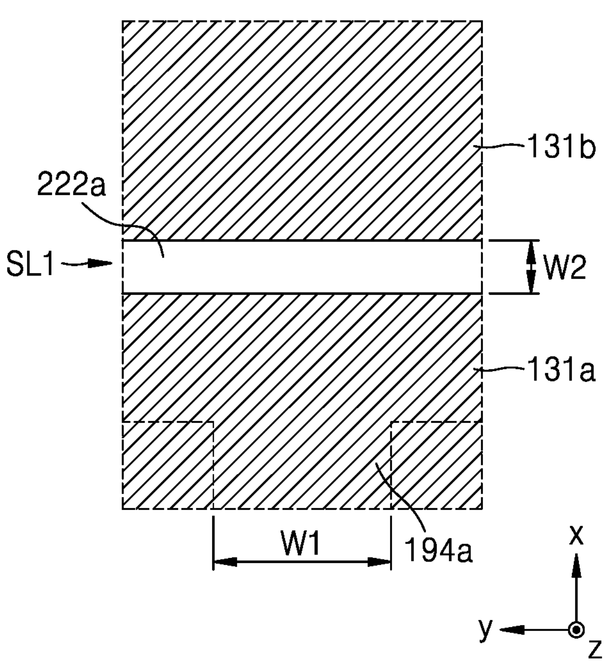
FIG. 3 is an enlarged view of a region P of FIG. 2.
Figure 4:
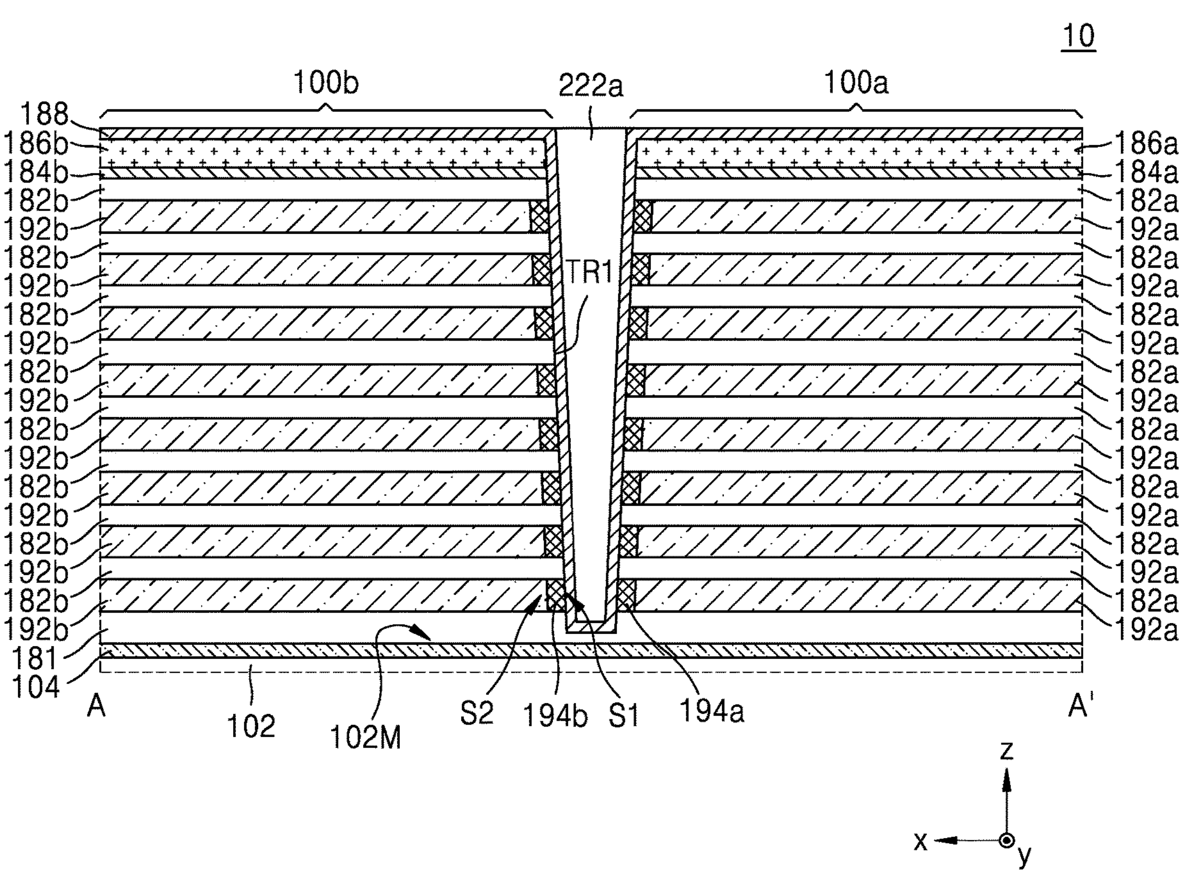
FIG. 4 is a cross-sectional view of the three-dimensional nonvolatile memory device taken along a line A-A' of FIG. 2.
Figure 5:
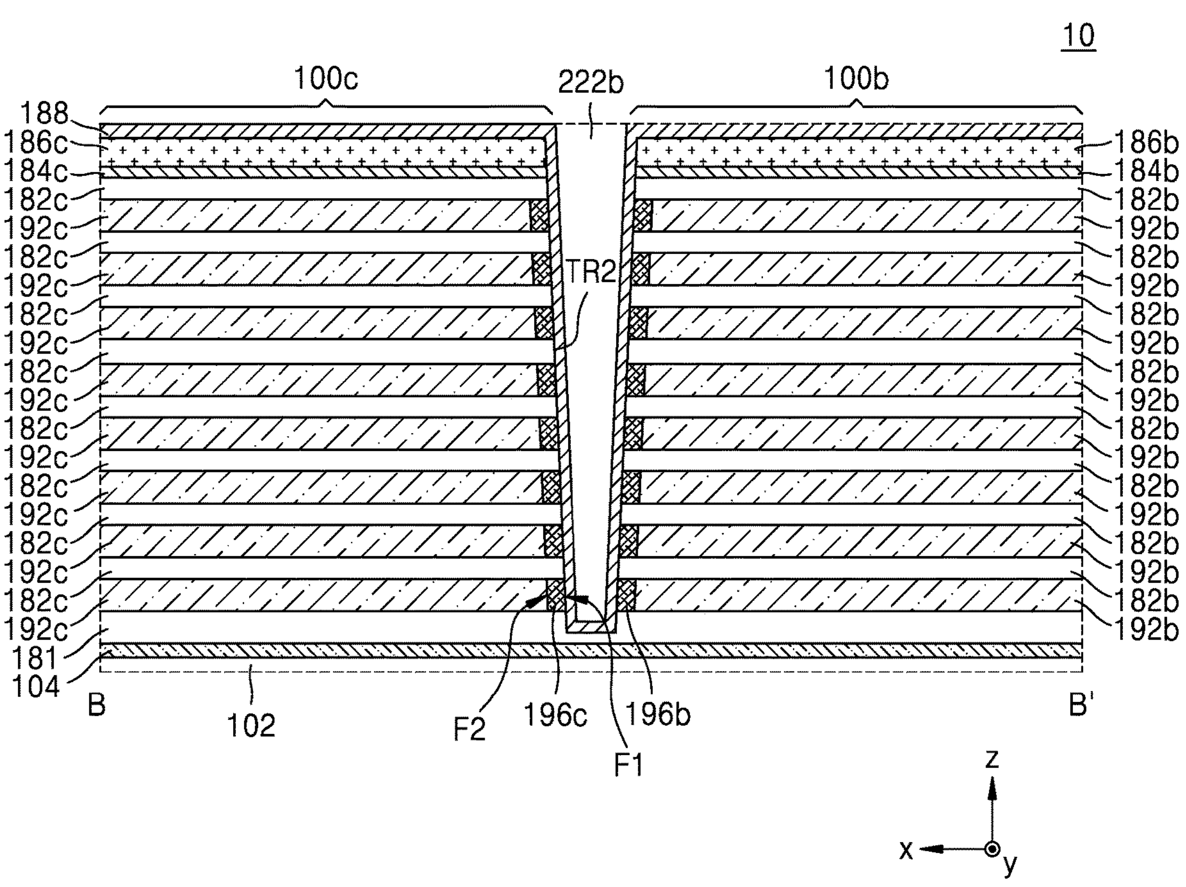
FIG. 5 is a cross-sectional view of the three-dimensional nonvolatile memory device taken along a line B-B' of FIG. 2.

FIG. 2 is a plan view of the three-dimensional nonvolatile memory device 10 according to an embodiment of the present inventive concept. FIG. 3 is an enlarged view of a region P of FIG. 2. FIG. 4 is a cross-sectional view of the three-dimensional nonvolatile memory device 10 taken along a line A-A' of FIG. 2. FIG. 5 is a cross-sectional view of the three-dimensional nonvolatile memory device 10 taken along a line B-B' of FIG. 2.

Referring to FIGS. 2 to 5, a plurality of slits SL1, SL2, and SL3 may be between a plurality of MCAs 100*a*, 100*b*, and 100*c* arranged in the first horizontal direction (e.g., the X-direction). Slit insulating layers 222*a*, 222*b*, and 222*c* may be filled in spaces in which the slits SL1, SL2, and SL3 are formed. The slits SL1, SL2, and SL3 may be start points and end points of metal inducted lateral crystallization (MILC) of a plurality of horizontal channel layers 192*a*, 192*b*, and 192*c* to be described below. As shown in FIG. 1, a first slit insulating layer 222*a* may be disposed between the plurality of bit line pad stacks 131*a* and 131*b* included in the first and second MCAs 100*a* and 100*b*, respectively, and the first and second MCAs 100*a* and 100*b* are different from each other. Accordingly, even when semiconductor patterns (e.g., first crystalline semiconductor patterns 194*a*, 194*b*, and 194*c* or second crystalline semiconductor patterns 196*a*, 196*b*, and 196*c*) having a high metal concentration are formed in areas in which the bit line pad stacks 131*a* and 131*b* are arranged, occurrence of a leakage current between the MCAs 100*a* and 100*b* may be prevented. The first slit insulating layer 222*a* may include, for example, a silicon oxide film, but the present inventive concept is not limited thereto.

The three-dimensional nonvolatile memory device 10 according to an embodiment of the present inventive concept may include a plurality of insulating layers 182*a* and 182*b* alternately stacked with the plurality of horizontal channel layer 192*a* and 192*b* on the substrate 102 in the vertical direction (e.g., the Z-direction) substantially perpendicular to the main surface 102M of the substrate 102. In this case, a first insulating layer 182*a* may be an insulating layer included in the first MCA 100*a*, and a second insulating layer 182*b* may be an insulating layer included in the second MCA 100*b*. In FIG. 4, the thicknesses of the plurality of insulating layers 182*a* and 182*b* are shown to be constant. However, according to some embodiments of the present inventive concept, some of the plurality of insulating layers 182*a* and 182*b* may have different thicknesses. The plurality of insulating layers 182*a* and 182*b* may include, for example, silicon oxide. The substrate 102 may include a semiconductor material, such as a group IV semiconductor material, a group III-V semiconductor material, a group II-VI semiconductor material, or a combination thereof. The group IV semiconductor material may include, e.g., silicon (Si), germanium (Ge), or a combination thereof. The group III-V semiconductor material may include, e.g., gallium arsenide (GaAs), indium phosphide (InP), gallium phosphide (GaP), indium arsenide (InAs), indium antimony (InSb), indium gallium arsenide (InGaAs), or a combination thereof. The group II-VI semiconductor material may include, e.g., zinc telluride (ZnTe), cadmium sulfide (CdS), or a combination thereof.

According to an embodiment of the present inventive concept, the three-dimensional nonvolatile memory device 10 may include a plurality of horizontal channel layers 192*a* and 192*b* positioned between the plurality of insulating layers 182*a* and 182*b* and elongated in the first horizontal direction (e.g., the X-direction) parallel to the main surface 102M of the substrate 102. The plurality of horizontal channel layers 192*a* and 192*b* may overlap each other in the vertical direction (e.g., the Z-direction). The plurality of horizontal channel layers 192*a* and 192*b* may include, for example, single crystal silicon (c-Si) including a first metal element.

A first etch stop layer 104 and an insulating material layers 181 may be sequentially stacked between the substrate 102 and the lowermost horizontal channel layer 192*b* of the plurality of horizontal channel layers 192*a* and 192*b*. The first etch stop layer 104 may protect the substrate 102, such that the substrate 102 is not etched when a first trench TR1 is formed. Unlike the plurality of insulating layers 182*a* and 182*b*, the lower insulating layer 181 is not limited to configurations of specific MCAs 100*a* and 100*b*, by the first trench TR1. The first etch stop layer 104 may include, for example, oxynitride or nitride. For example, the first etch stop layer 104 may include, for example, silicon oxynitride (SiON) or silicon nitride (SiN).

The three-dimensional nonvolatile memory device 10 according to an embodiment of the present inventive concept may include a diffusion stop layer 188 conformally formed in the first trench TR1 that passes through a plurality of first insulating layers 182*a*, a plurality of second insulating layers 182*b*, first horizontal channel layers 192*a*, and second horizontal channel layers 192*b* in the vertical direction (e.g., the Z-direction). The diffusion stop layer 188 may include, for example, silicon nitride. The diffusion stop layer 188 may prevent metal elements included in the first horizontal channel layers 192*a*, the second horizontal channel layers 192*b*, and the first crystalline semiconductor patterns 194*a* and 194*b* to be described below, from diffusing into another MCA or the first slit insulating layer 222*a*.

The three-dimensional nonvolatile memory device 10 according to an embodiment of the present inventive concept may include upper etch stop layers 184*a* and 184*b* and upper insulating layers 186*a* and 186*b*, which are sequentially stacked on the uppermost first insulating layer 182*a* and the uppermost second insulating layer 182*b*. The upper etch stop layers 184*a* and 184*b* may include, for example, silicon nitride, and the upper insulating layers 186*a* and 186*b* may include, for example, silicon oxide, but the present inventive concept is not limited thereto.

The three-dimensional nonvolatile memory device 10 according to an embodiment of the present inventive concept may include the first crystalline semiconductor patterns 194*a* and 194*b* including a second metal element and positioned between each of the plurality of first horizontal channel layers 192*a* or the plurality of second horizontal channel layers 192*b* and the diffusion stop layer 188. The first crystalline semiconductor patterns 194*a* and 194*b* may include c-Si. In this case, the concentration of the second metal element in the first crystalline semiconductor patterns 194*a* and 194*b* may be higher than the concentration of the first metal element in the plurality of horizontal channel layers 192*a* and 192*b*. The first metal element and the second metal element may be the same element. In this case, the first metal element and the second metal element may each be one of, for example, nickel (Ni) or palladium (Pd). The first crystalline semiconductor patterns 194*a* and 194*b* having a higher metal element concentration are arranged far from the plurality of vertical word line structures 140 (see FIG. 1) and close to the first slit insulating layer 222a, such that a leakage current that may occur in a P-N junction may be prevented.

The first crystalline semiconductor patterns 194a and 194b may each include a first surface S1, which is in contact with the diffusion stop layer 188, and a second surface S2, which is opposite to the first surface S1 and in contact with the first horizontal channel layer 192a or the second horizontal channel layer 192b. For example, the first horizontal channel layer 192a or the second horizontal channel layer 192b may be a c-Si layer formed by diffusion of the metal element included in the first crystalline semiconductor patterns 194a and 194b. Accordingly, a boundary such as a clear interface is not present between the first crystalline semiconductor patterns 194a and 194b and the first horizontal channel layer 192a or the second horizontal channel layer 192b, but rather the first crystalline semiconductor patterns 194a and 194b and the first horizontal channel layer 192a or the second horizontal channel layer 192b may be materially and continuously formed. The first horizontal channel layer 192a, the second horizontal channel layer 192b, and the first crystalline semiconductor patterns 194a and 194b may each be a single crystal pattern in a (111) crystal direction. As shown in FIG. 4, a width of the first horizontal channel layer 192a or the second horizontal channel layer 192b in the first horizontal direction (e.g., the X-direction) may be greater than a width of the first crystalline semiconductor patterns 194a and 194b in the first horizontal direction (e.g., the X-direction). A width of the first crystalline semiconductor patterns 194a and 194b having a high concentration of the second metal element in the first horizontal direction (e.g., the X-direction) may be relatively less than a width of the horizontal channel layers 192a and 192b having a low concentration of the first metal element in the first horizontal direction (e.g., the X-direction).

As shown in FIG. 3, a width w1 of the first crystalline semiconductor patterns 194a and 194b in the second horizontal direction (e.g., the Y-direction) substantially perpendicular to the first horizontal direction (e.g., the X-direction) may be greater than a width w2 of the first slit insulating layer 222a in the first horizontal direction (e.g., the X-direction). Because the width w1 of the first crystalline semiconductor patterns 194a and 194b in the second horizontal direction (e.g., the Y-direction) is relatively wide, the MILC may be uniformly performed. However, the present inventive concept inventive concept is not limited thereto. According to some embodiments of the present inventive concept, the width w1 of the first crystalline semiconductor patterns 194a and 194b in the second horizontal direction (e.g., the Y-direction) substantially perpendicular to the first horizontal direction (e.g., the X-direction) may be less than the width w2 of the first slit insulating layer 222a in the first horizontal direction (e.g., the X-direction). In the case of a typical three-dimensional nonvolatile memory device 10, a channel layer passing through a plurality of word line structures may be formed in a plurality of word line structures vertically stacked. In this case, because a diameter of the channel layer passing through the plurality of word line structures is less than a vertical height thereof, a probability of the occurrence of local micro-crystallization may be high. When local micro-crystallization occurs in the channel layer having a narrow diameter, crystallization might not proceed any further based on a point where micro-crystallization has occurred. However, as in the present embodiment, even when the horizontal channel layers 192a and 192b are stacked on the main surface 102M of the substrate 102 in the vertical direction (e.g., the Z-direction) and local micro-crystallization occurs due to a wide width of the horizontal channel layers 192a and 192b in the first horizontal direction (e.g., the X-direction), the MILC may be continuously performed by avoiding the micro-crystallization.

Referring to FIG. 5 together with FIGS. 2 to 4, the three-dimensional nonvolatile memory device 10 according to an embodiment of the present inventive concept may include a second slit SL2 that separates the second MCA 100b and the third MCA 100c from each other. The three-dimensional nonvolatile memory device 10 may include a plurality of second insulating layers 182b and a plurality of third insulating layers 182c stacked on the substrate 102 in the vertical direction (e.g., the Z-direction) substantially perpendicular to the main surface 102M of the substrate 102. The second insulating layers 182b are insulating layers included in the second MCA 100b, and the third insulating layers 182c are insulating layers included in the third MCA 100c. Although thicknesses of the plurality of second insulating layers 182b and the plurality of third insulating layers 182c are shown to be constant in the drawings, some of the plurality of second insulating layers 182b and third insulating layers 182c may have different thicknesses from each other according to some embodiments of the present inventive concept. The plurality of second insulating layers 182b and the plurality of third insulating layers 182c may each include, for example, silicon oxide.

According to an embodiment of the present inventive concept, the three-dimensional nonvolatile memory device 10 may include a plurality of second horizontal channel layers 192b and a plurality of third horizontal channel layers 192c. The plurality of second horizontal channel layers 192b may be alternately stacked with the plurality of second insulating layers 182b in a direction substantially perpendicular to the main surface 102M of the substrate 102, and the plurality of third horizontal channel layers 192c may be alternately stacked with the plurality of third insulating layers 182c in a direction substantially perpendicular to the main surface 102M of the substrate 102. The plurality of second horizontal channel layers 192b and the plurality of third horizontal channel layers 192c may be elongated in the first horizontal direction (e.g., the X-direction). The plurality of second horizontal channel layers 192b are channel layers included in the second MCA 100b, and the plurality of third horizontal channel layers 192c are channel layers included in the third MCA 100c. The plurality of third horizontal channel layers 192c may include c-Si including a first metal element.

The three-dimensional nonvolatile memory device 10 according to an embodiment of the present inventive concept may include a diffusion stop layer 188 conformally formed in a second trench TR2 passing through the plurality of second insulating layers 182b, the plurality of third insulating layers 182c, the second horizontal channel layers 192b, and the third horizontal channel layers 192c in the vertical direction (e.g., the Z-direction). The diffusion stop layer 188 may include, for example, silicon nitride. The diffusion stop layer 188 may prevent metal elements included in the second horizontal channel layers 192b, the third horizontal channel layers 192c, and second crystalline semiconductor patterns 196b and 196c to be described below, from diffusing into another MCA or the second slit insulating layer 222b.

The three-dimensional nonvolatile memory device 10 according to an embodiment of the present inventive concept may include the second crystalline semiconductor patterns 196b and 196c including a third metal element and positioned between each of the plurality of second horizontal channel layers **192*b* or the plurality of third horizontal channel layers 192*c* and the diffusion stop layer 188. The second crystalline semiconductor patterns 196*b* and 196*c* may include c-Si. In this case, the concentration of the third metal element in the second crystalline semiconductor patterns 196*b* and 196*c* may be higher than the concentration of the first metal element included in the plurality of second horizontal channel layers 192*b* or the plurality of third horizontal channel layers 192*c*. The first metal element and the third metal element may be the same element. In this case, the first metal element and the third metal element may each be one of, for example, Ni or Pd. The second crystalline semiconductor patterns 196*b* and 196*c* having a higher metal element concentration are arranged far from the plurality of vertical word line structures 140 (see FIG. 1) and close to the second slit insulating layer 222*b*, such that a leakage current that may occur in a P-N junction may be prevented. The concentration of the third metal element included in the second crystalline semiconductor patterns 196*b* and 196*c* is lower than the concentration of the second metal element included in the first crystalline semiconductor patterns 194*a* and 194*b***.

The second crystalline semiconductor patterns **196*b* and 196*c* may each include a first surface F1 and a second surface F2. The first surface F1 may be in contact with the diffusion stop layer 188, and the second surface F2 is opposite to the first surface F1 and may be in contact with the second horizontal channel layer 192*b* or the third horizontal channel layer 192*c*. The second horizontal channel layer 192*b* and the third horizontal channel layer 192*c* may be a c-Si layer formed by diffusion of the metal element included in the first crystalline semiconductor patterns 194*a* and 194*b*. A boundary such as a clear interface is not present between the second crystalline semiconductor patterns 196*b* and 196*c* and the second horizontal channel layer 192*b* or the third horizontal channel layer 192*c*, but rather the second crystalline semiconductor patterns 196*b* and 196*c* and the second horizontal channel layer 192*b* or the third horizontal channel layer 192*c* may be materially and continuously formed. The third horizontal channel layer 192*c* and the second crystalline semiconductor patterns 196*b* and 196*c*** may each be a single crystal pattern in a (111) crystal direction.

FIGS. 6A, 6B, 7A, 7B, 8A, 8B, 9A, 9B, 10 to 13, 15A to 15C, and 16A to 16C are cross-sectional views sequentially illustrating a method of manufacturing a three-dimensional nonvolatile memory device, according to an embodiment of the present inventive concept.

Figure 6A:
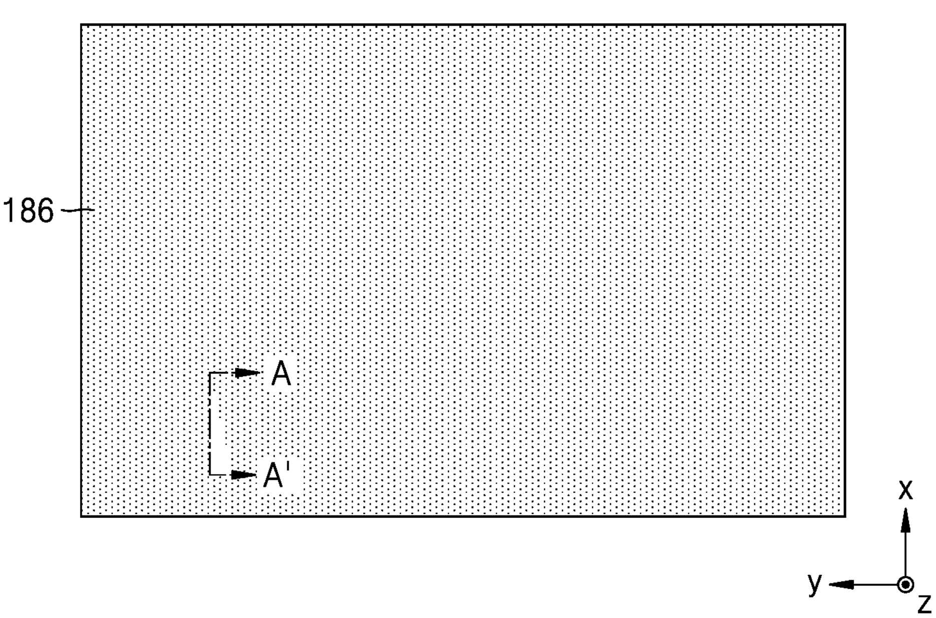
FIGS. 6A, 6B, 7A, 7B, 8A, 8B, 9A, 9B, 10, 11, 12 and 13, 15A,15B, 15C, and 16A, 16B, and 16C are cross-sectional views sequentially illustrating a method of manufacturing a three-dimensional nonvolatile memory device, according to an embodiment of the present inventive concept.
Figure 6B:
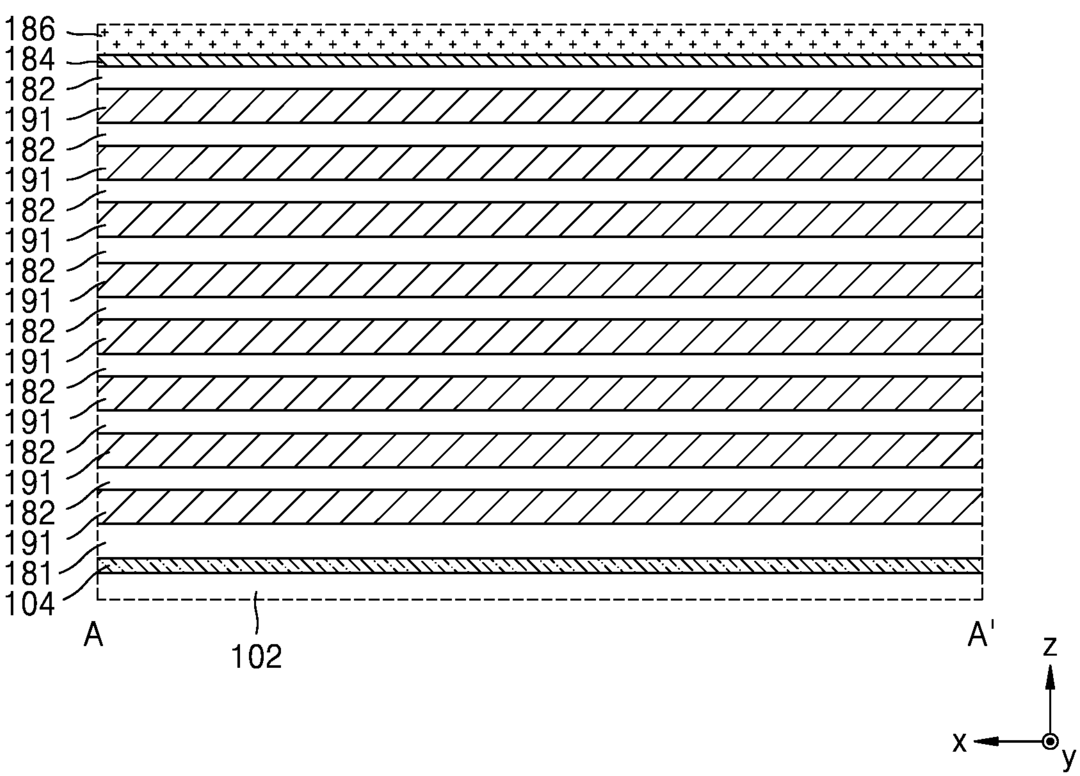

Referring to FIGS. 6A and 6B, a method of manufacturing a three-dimensional nonvolatile memory device 10 according to an embodiment of the present inventive concept may include forming a lower etch stop layer 104 on a main surface of a substrate 102. Then, the method may include alternately and repeatedly forming a plurality of channel material layers 191 with a plurality of insulating material layers 181 and 182 on the lower etch stop layer 104 in the vertical direction (e.g., the Z-direction). For example, an insulating material layer 181 may be the lowermost of the plurality of insulating material layer 181 and 182. For example, the forming of the insulating material layers 181 and 182 may include forming silicon oxide layers by performing a deposition process. For example, the forming of the channel material layers 191 may include forming an amorphous silicon layer by performing a deposition process. The method may include sequentially depositing the first etch stop layer 184 and an upper insulating layer 186, after the plurality of insulating material layers 181 and 182 and the plurality of channel material layers 191 are formed. For example, the forming of the first etch stop layer 184 may include forming silicon nitride by performing a deposition process. In addition, the forming of the upper insulating layer 186 may include forming silicon oxide by performing a deposition process. The aforementioned deposition process may include atomic layer deposition (ALD), but the present inventive concept is not limited thereto.

Figure 7A:
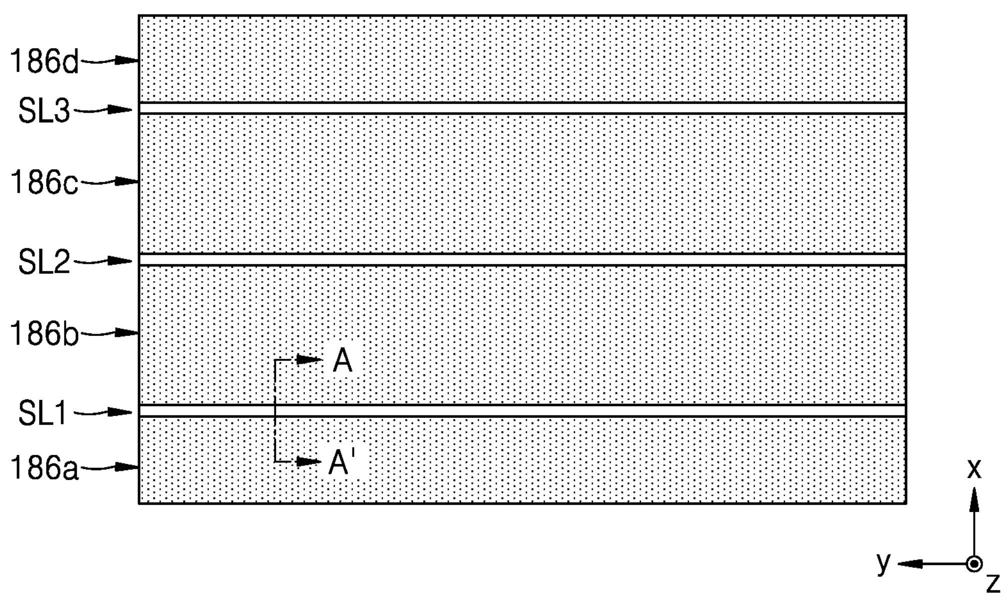
Figure 7B:
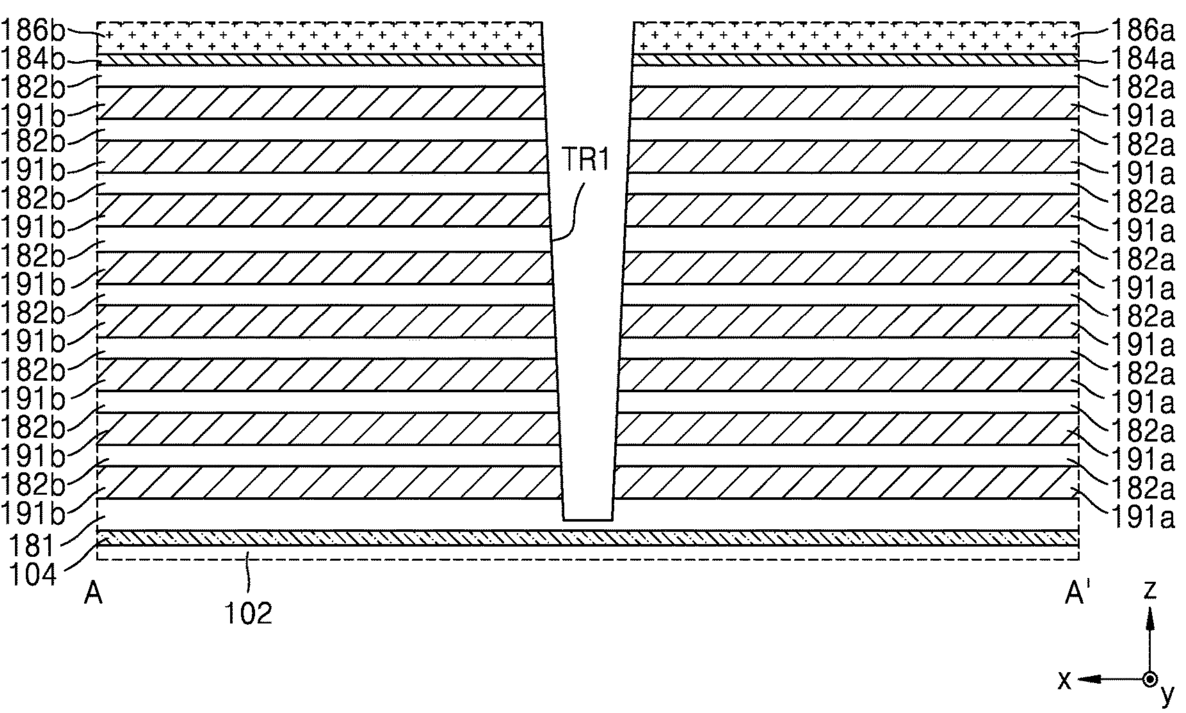

Referring to FIGS. 7A and 7B, the method of manufacturing the three-dimensional nonvolatile memory device 10 according to an embodiment of the present inventive concept may include forming the plurality of slits SL1, SL2, and SL3. As shown in FIG. 7A, by forming the plurality of slits SL1, SL2, and SL3, the upper insulating layer 186 may be defined by being divided into a first upper insulating layer **186*a*, a second upper insulating layer 186*b*, a third upper insulating layer 186*c*, and a fourth upper insulating layer 186*d*, based on the plurality of slits SL1, SL2, and SL3. As shown in FIG. 7B, forming of the first slit SL1 may include forming a first trench TR1. The first trench TR1 may cut the upper insulating layer 186, the first etch stop layer 184, the plurality of insulating material layers 181 and 182, and the plurality of channel material layers 191. Some of the insulating material layers 181 and 182 cut by the first trench TR1 may be divided into a first insulating layer 182*a* and a second insulating layer 182*b*. The first insulating layer 182*a* may be an insulating layer included in the first MCA 100*a* (see FIG. 2) formed later, and the second insulating layer 182*b* may be an insulating layer included in the second MCA 100*b* (see FIG. 2) formed later. The bottom of the first trench TR1 may be positioned in the middle of the insulating material layers 181 that is the lowermost of the plurality of insulating material layers 181 and 182. Others of the insulating material layers 181 and 182 that are not completely cut by the first trench TR1 may not be insulating layers belonging to a specific MCA. For example, the lowermost insulating material layer 181 might not be completely cut by the first trench TR1**.

Figure 8A:
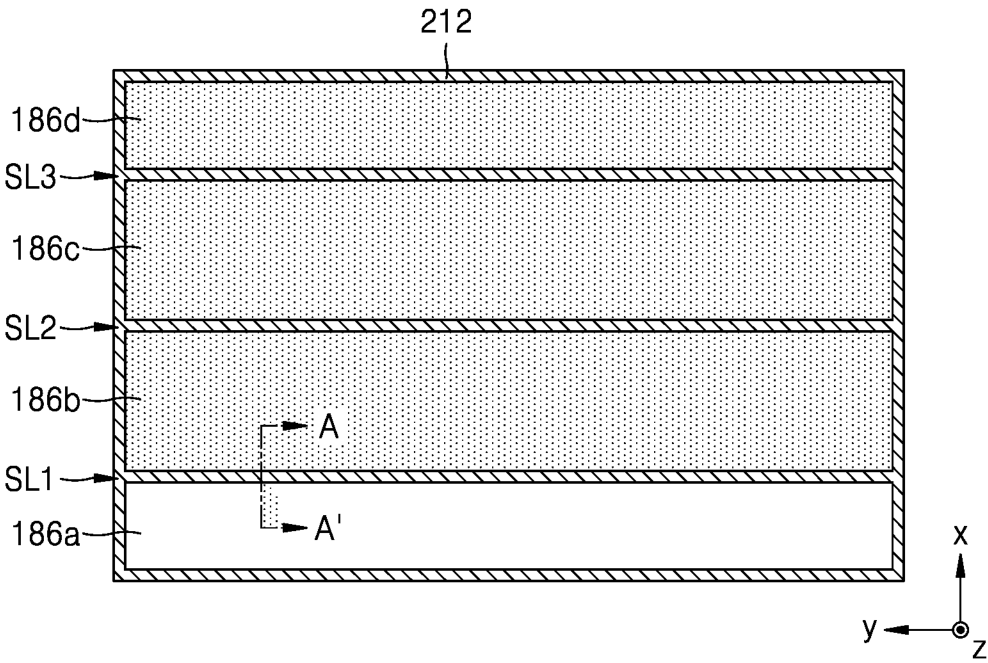
Figure 8B:
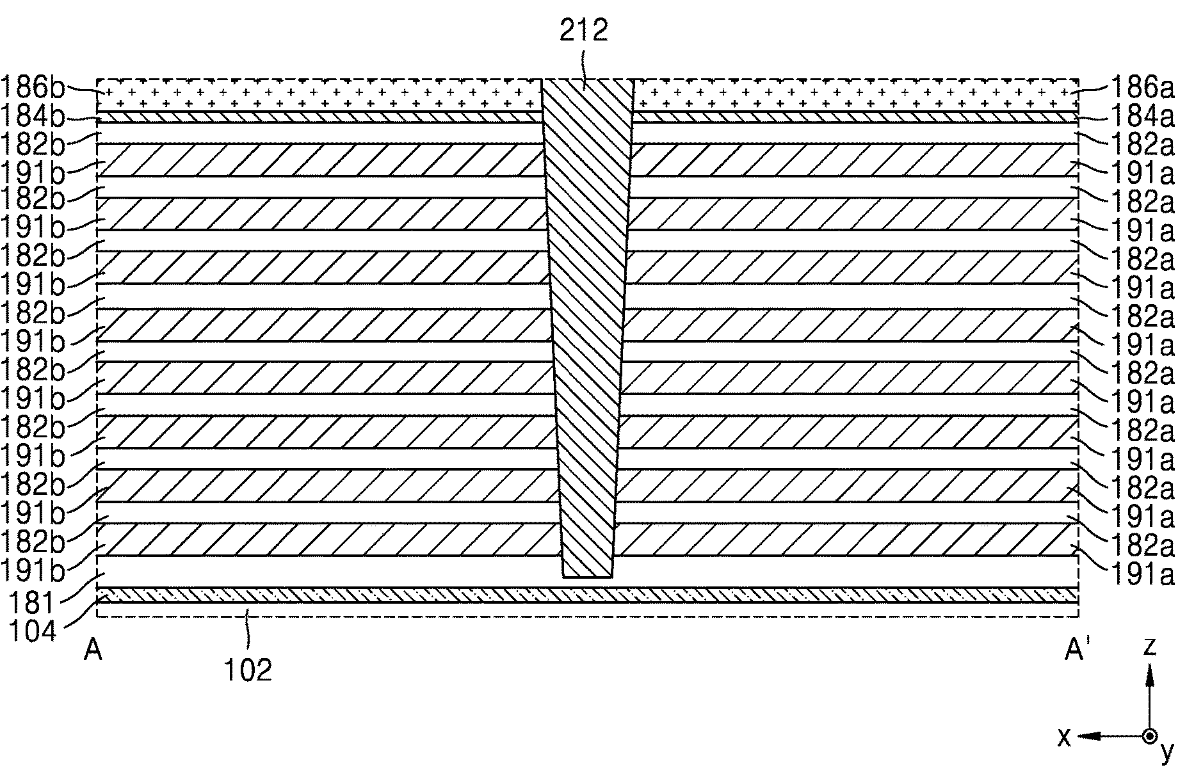

Referring to FIGS. 8A and 8B, the method of manufacturing the three-dimensional nonvolatile memory device 10 according to an embodiment of the present inventive concept may include forming a sacrificial layer 212 filling the insides of the plurality of slits SL1, SL2, and SL3, and performing a carbonization process such as chemical mechanical polishing (CMP), such that the upper surface of the sacrificial layer 212 is substantially coplanar with the upper surfaces of the first and second insulating layers **186*a* and 186*b*. As shown in FIG. 8B, the sacrificial layer 212 may fill the inside of the first trench TR1. For example, the sacrificial layer 212 may completely fill the inside of the first trench TR1**.

The forming of the sacrificial layer 212 may include forming an insulating material to fill the inside of the first trench TR1. For example, the sacrificial layer 212 may include silicon nitride.

Figure 9A:
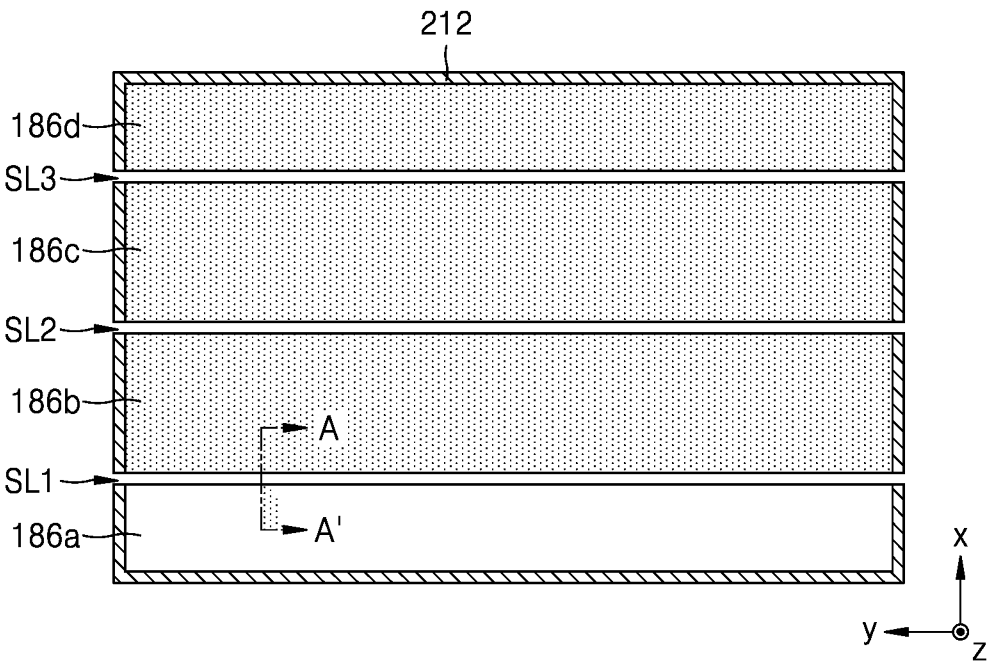
Figure 9B:
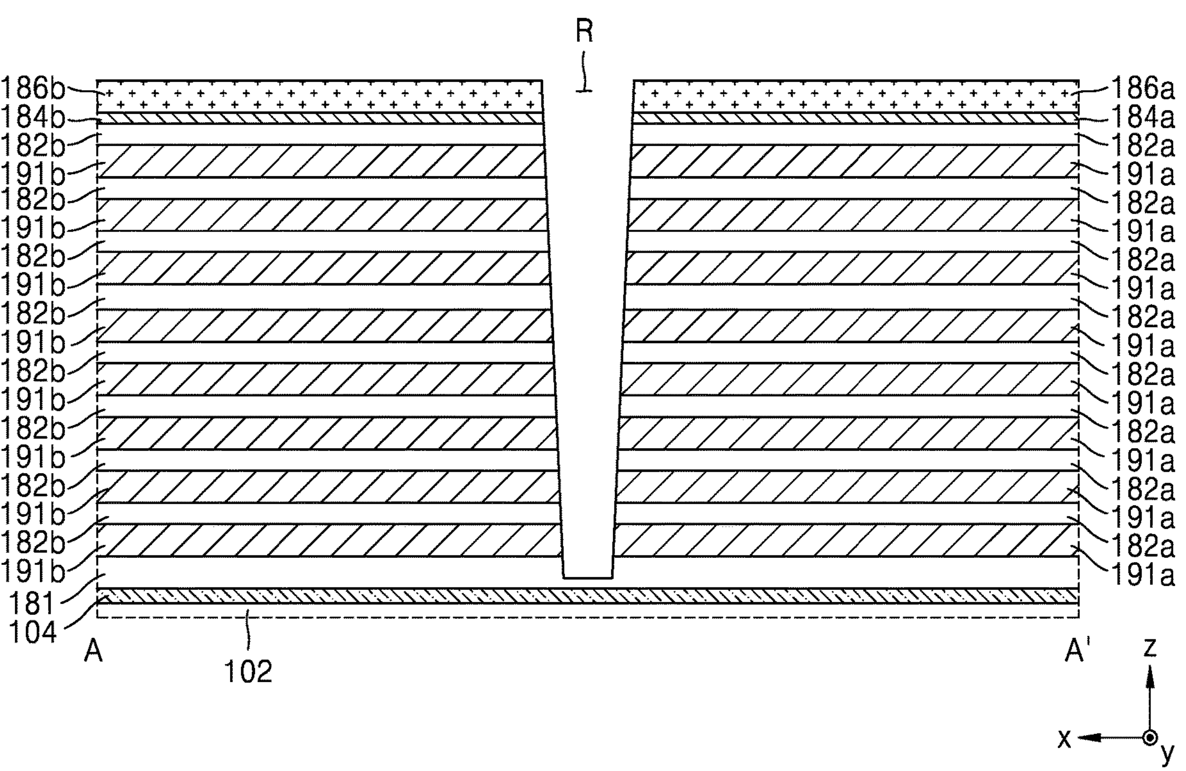

Referring to FIGS. 9A and 9B, the method of manufacturing the three-dimensional nonvolatile memory device 10 according to an embodiment of the present inventive concept may include removing the sacrificial layer 212 that fills the insides of the first slit SL1 and the second slit SL2. As shown in FIG. 9B, by removing the sacrificial layer 212 that fills the inside of the first slit SL1, a recess R may be formed inside the first trench TR1.

FIGS. 10 to 13 are diagrams illustrating a crystallization method of the method of manufacturing the three-dimensional nonvolatile memory device 10, according to an embodiment of the present inventive concept. The crystallization method may include crystallizing the channel material layers 191 into c-Si.

Figure 10:
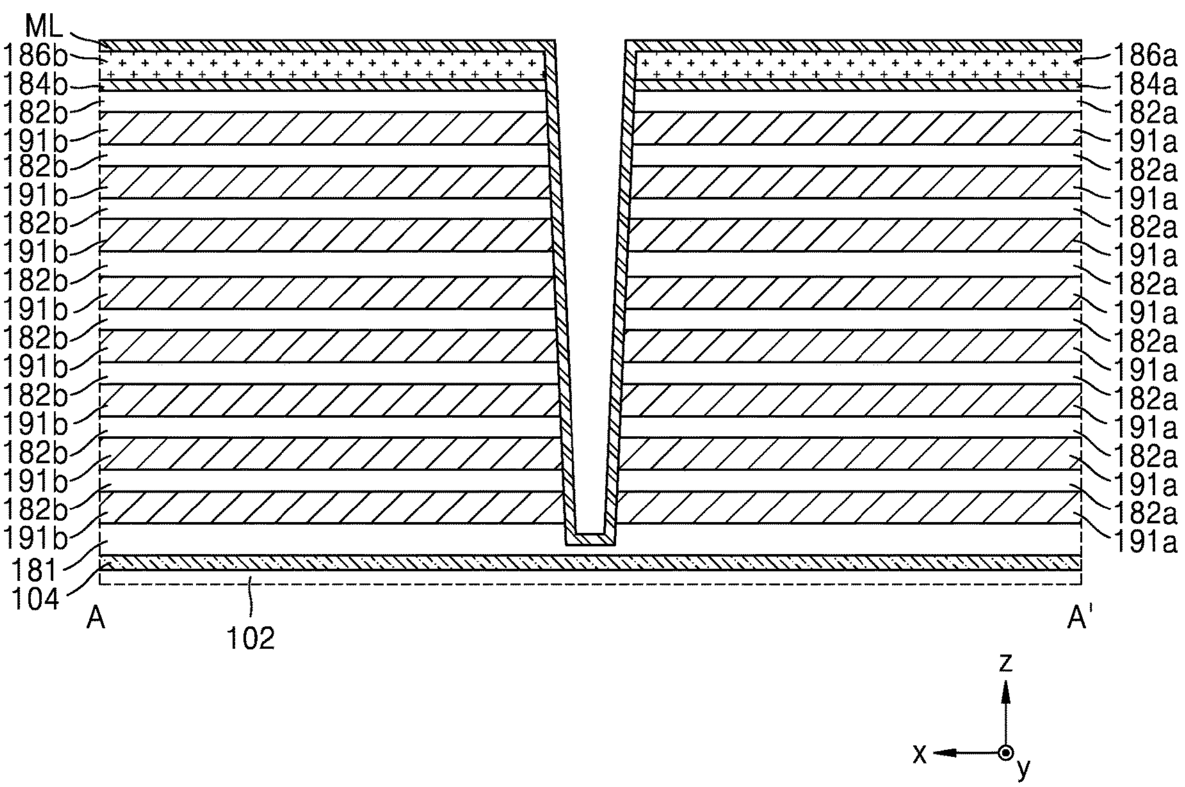

Referring to FIG. 10, the crystallization method may include conformally forming a metal catalyst layer ML inside the recess R. The forming of the metal catalyst layer ML may include conformally depositing the metal catalyst layer ML to cover side surfaces of the plurality of insulating layers 182*a* and 182*b*, the plurality of channel material layers 191 (e.g., 191*a* and 191*b*), and the first etch stop layer 104, and upper and side surfaces of the upper insulating layers 186*a* and 186*b*. The forming of the metal catalyst layer ML may include forming a metal on the side surfaces of the plurality of channel material layers 191 by performing a deposition process or a sputtering process. The metal catalyst layer ML may include, e.g., one of Ni or Pd.

Figure 11:
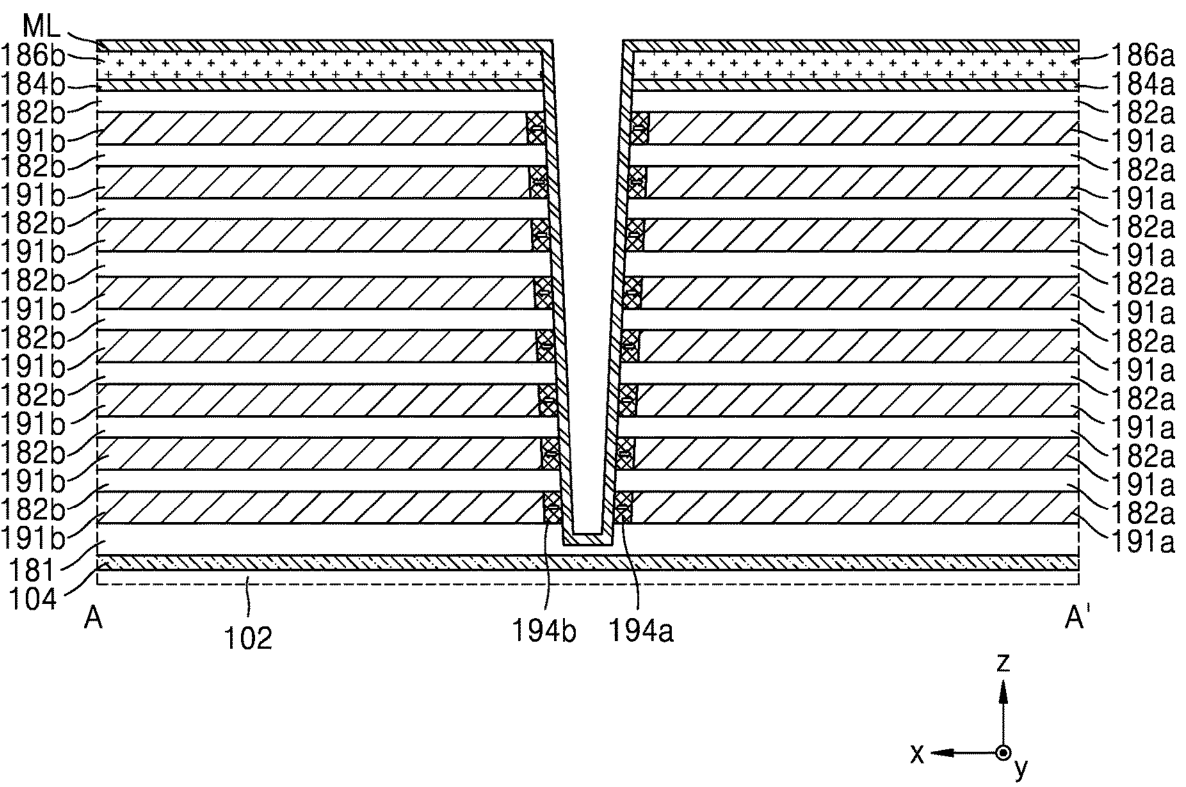

Referring to FIG. 11, the crystallization method may include crystallizing the channel material layers 191 into c-Si by performing an annealing process. The annealing process may be performed at a temperature of about 400° C. to about 650° C.

The crystallizing of the channel material layers 191 into c-Si may include diffusing the metal of the metal catalyst layer ML by the annealing process, causing the diffused metal to be in direct contact with the side surfaces of the channel material layers 191, and crystallizing the channel material layers 191 including amorphous silicon (a-Si) into c-Si by metal induced crystallization (MIC).

For example, in the present embodiment, the metal catalyst layer ML conformally covers the side surfaces of the channel material layers 191 including a-Si. Accordingly, the channel material layers 191 may be single-crystallized by the MIC in the first horizontal direction (e.g., the X-direction) (e.g., a white arrow direction) from the side surfaces thereof that are in contact with the metal catalyst layer ML.

In this process, some of the channel material layers 191 including a-Si may be crystallized by the annealing process and converted into the first crystalline semiconductor patterns 194*a* and 194*b*.

Figure 12:
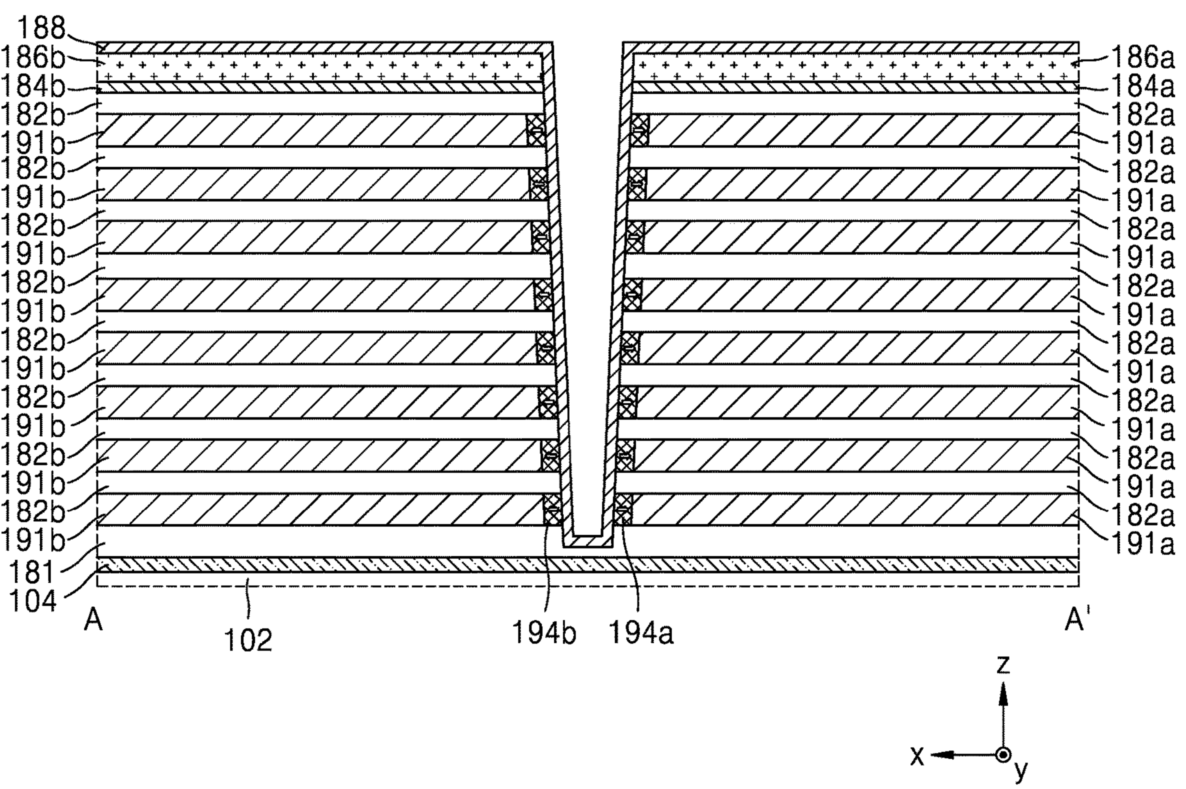

Referring to FIG. 12, the crystallization method includes conformally forming the diffusion stop layer 188, after the metal catalyst layer ML is removed. The diffusion stop layer 188 may be formed to cover side surfaces of the plurality of first crystalline semiconductor patterns 194*a* and 194*b*, side surfaces of the plurality of insulating layers 182*a* and 182*b*, and upper and side surfaces of the upper insulating layer 186. For example, the forming of the diffusion stop layer 188 may include forming silicon nitride to cover the side surfaces of the first crystalline semiconductor patterns 194*a* and 194*b*, the side surfaces of the plurality of insulating layers 182*a* and 182*b*, and the upper and side surfaces of the upper insulating layer 186 through a deposition process or a sputtering process. Because the diffusion stop layer 188 is formed on the side surfaces of the first crystalline semiconductor patterns 194*a* and 194*b*, a metal included in the first crystalline semiconductor patterns 194*a* and 194*b* may be prevented from penetrating into the first trench TR1.

Figure 13:
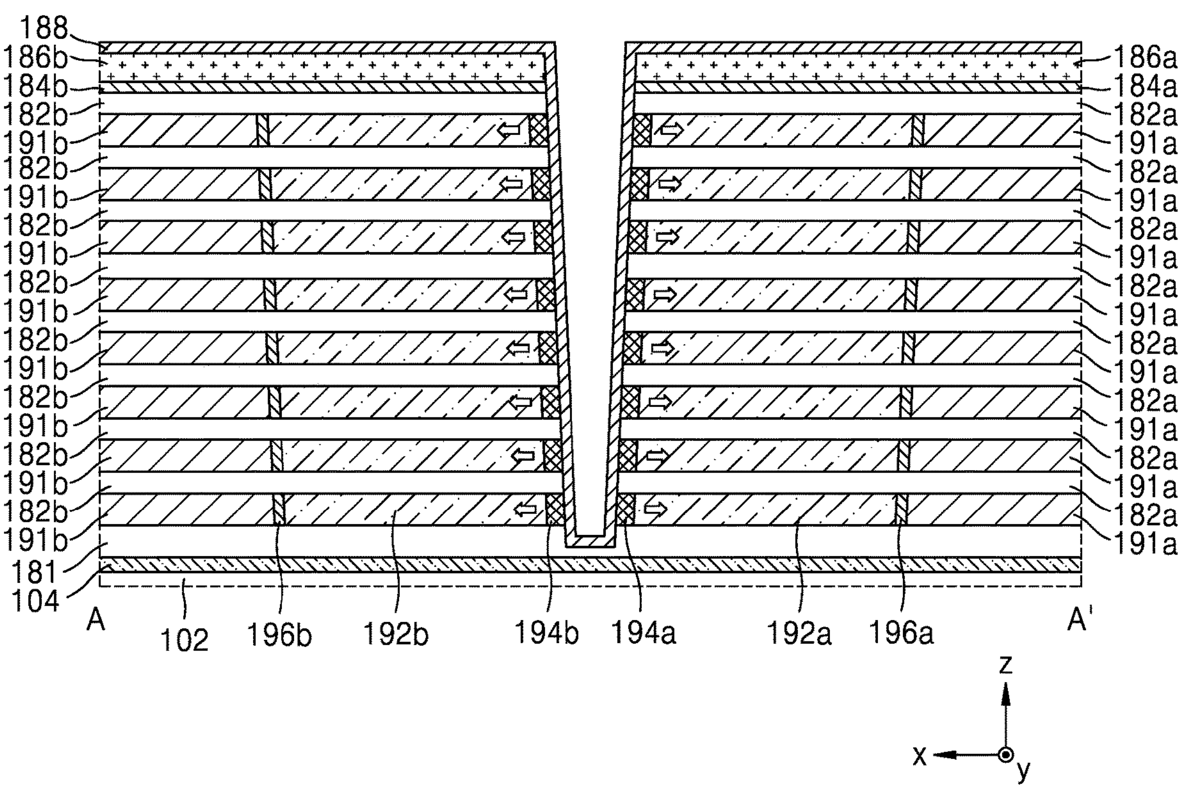

Referring to FIG. 13, the crystallization method may include crystallizing the channel material layers 191 in contact with the first crystalline semiconductor patterns 194*a* and 194*b* into c-Si by performing an annealing process. When the channel material layers 191 are crystallized into c-Si, the horizontal channel layers 192*a* and 192*b* may be formed. The annealing process may be performed at a temperature of about 400° C. to about 650° C.

The crystallizing of the channel material layers 191 into c-Si may include diffusing the metal of the first crystalline semiconductor patterns 194*a* and 194*b* by the annealing process, and crystallizing the channel material layers 191 into c-Si by the MILC due to penetration of the diffused metal into the channel material layers 191. During the annealing process, the channel material layers 191 may be crystallized into c-Si in the first horizontal direction (e.g., the X-direction) (e.g., the white arrow direction) along the side surfaces of the channel material layers 191 starting from a point where the first crystalline semiconductor patterns 194*a* and 194*b* are formed. In the case of a typical three-dimensional nonvolatile memory device, a channel layer penetrating a plurality of vertically stacked word line structures may be formed in the plurality of word line structures. In this case, because a diameter of the channel layer passing through the plurality of word line structures is less than a vertical height thereof, a probability of the occurrence of local micro-crystallization may be high. When local micro-crystallization occurs in the channel layer having a narrow diameter, crystallization might not proceed any further based on a point where micro-crystallization has occurred. However, as in the present embodiment, even when channel material layers 191*a* and 191*b* are stacked on a main surface of the substrate 102 in the vertical direction (e.g., the Z-direction) and local micro-crystallization occurs due to a wide width of the channel material layers 191*a* and 191*b* in the first horizontal direction (X-direction), the MILC may be continuously performed by avoiding the micro-crystallization.

In this case, the second crystalline semiconductor patterns 196*a* and 196*b* may be formed on a surface of the channel material layers 191 opposite to another surface of the channel material layer 191 that is in contact with the first crystalline semiconductor patterns 194*a* and 194*b*. The second crystalline semiconductor patterns 196*a* and 196*b* may include a third metal element. A concentration of the third metal element included in the second crystalline semiconductor patterns 196*a* and 196*b* may be higher than each of the concentration of the first metal element included in the horizontal channel layers 192*a* and 192*b* and the concentration of the second metal element included in the first crystalline semiconductor patterns 194*a* and 194*b*. In this case, the first metal element, the second metal element, and the third metal element may be the same type of metal element. A metal included in the second crystalline semiconductor patterns 196*a* and 196*b* may crystallize the channel material layers 191 including a-Si into c-Si by penetrating into the channel material layers 191 that are in contact with the second crystalline semiconductor patterns 196*a* and 196*b*. The horizontal channel layers 192*a* and 192*b* crystallized by the MILC may have a relatively larger grain size than that of the first crystalline semiconductor patterns 194*a* and 194*b* crystallized by the MIC. In addition, the concentration of the first metal element included in the horizontal channel layers 192*a* and 192*b* crystallized by the MILC may be up to about 100 times lower than the concentration of the second metal element in the first crystalline semiconductor patterns 194*a* and 194*b* crystallized by the MIC.

FIGS. 14A to 14D are cross-sectional views sequentially illustrating a method of manufacturing a three-dimensional nonvolatile memory device, according to an embodiment of the present inventive concept.

When a crystallization method shown in FIGS. 14A to 14D is compared to the crystallization method shown in FIGS. 10 to 13, the crystallization methods are almost the same or similar, except that an insulating barrier layer 232 is disposed between the metal catalyst layer ML and the horizontal channel layers 192*a* and 192*b* that are subject to crystallization. However, the present inventive concept is not limited thereto. In an embodiment of the present inventive concept, the insulating barrier layer 232 may be disposed on the metal catalyst layer ML.

Figure 14A:
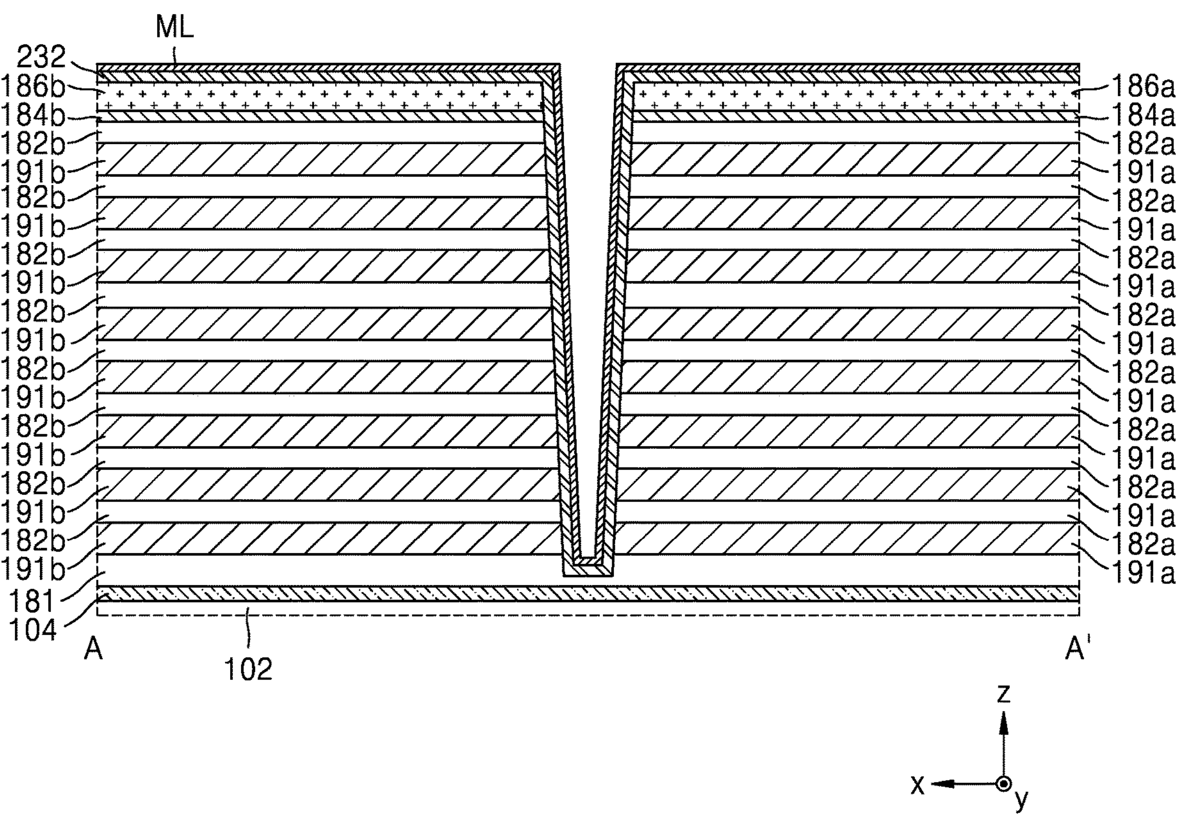
FIGS. 14A, 14B, 14C, and 14D are cross-sectional views sequentially illustrating a method of manufacturing a three-dimensional nonvolatile memory device, according to an embodiment of the present inventive concept.

Referring to FIG. 14A, the crystallization method may include conformally forming the insulating barrier layer 232 inside the recess R. The forming of the insulating barrier layer 232 may include conformally depositing the insulating barrier layer 232 to cover side surfaces of the plurality of insulating layers 182*a* and 182*b*, the plurality of channel material layers 191, and the first etch stop layer 184, and upper and side surfaces of the upper insulating layer 186. The forming of the insulating barrier layer 232 may include forming any one of silicon oxide ($SiO_2$), silicon nitride ($Si_3N_4$), or silicon oxynitride (SiON) to a thickness of about 0.5 nm to about 20 nm on the side surfaces of the plurality of channel material layers 191, by performing a deposition process or a sputtering process. However, the present inventive concept is not limited thereto. Then, the metal catalyst layer ML may conformally cover an upper surface of the insulating barrier layer 232. For example, the forming of the metal catalyst layer ML may include forming a metal on the insulating barrier layer 232 by performing a deposition process or a sputtering process. The metal catalyst layer ML may include, e.g., one of Ni or Pd.

Figure 14B:
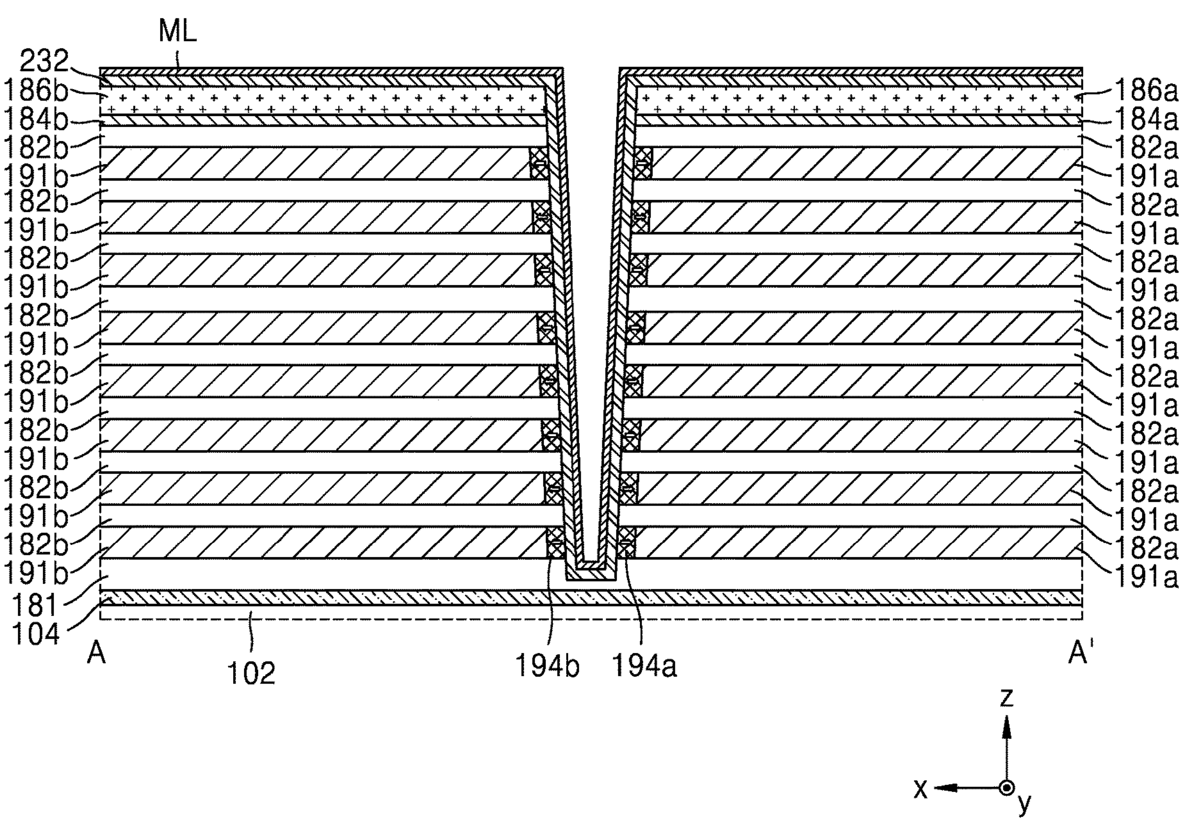

Referring to FIG. 14B, the crystallization method may include crystallizing the channel material layers 191 into c-Si by performing an annealing process. The annealing process may be performed at a temperature of about 400° C. to about 650° C.

The crystallizing of the channel material layers 191 into c-Si may include diffusing the metal of the metal catalyst layer ML by the annealing process, causing the diffused metal to be in direct contact with the side surfaces of the channel material layers 191 by passing through the insulating barrier layer 232 that is relatively thin, and crystallizing some of the channel material layers 191 into c-Si by the MIC.

For example, in the present embodiment, the channel material layers 191 may be single-crystallized by the MIC in the first horizontal direction (e.g., the X-direction) (e.g., the white arrow direction) from the side surfaces of the channel material layers 191 that are overlapped by the insulating barrier layer 232. For example, the side surfaces of the channel material layers 191 may be in contact with the insulating barrier layer 232.

In this process, some of the channel material layers 191 including a-Si may be crystallized by the annealing process and converted into the first crystalline semiconductor patterns 194*a* and 194*b*.

Figure 14C:
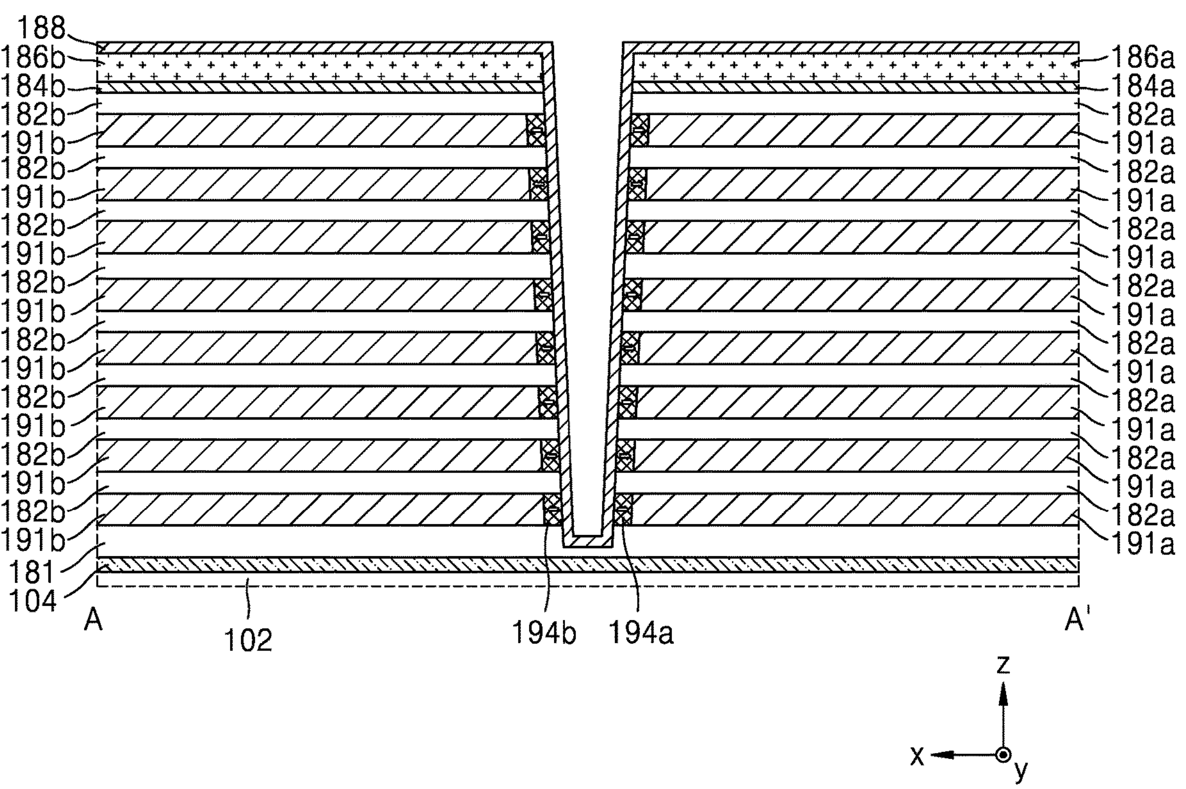

Referring to FIG. 14C, the crystallization method may include conformally forming the diffusion stop layer 188, after the metal catalyst layer ML and the insulating barrier layer 232 are removed. The diffusion stop layer 188 may be formed to cover the side surfaces of the plurality of first crystalline semiconductor patterns 194*a* and 194*b*, the side surfaces of the plurality of insulating layers 182*a* and 182*b*, and the upper and side surfaces of the upper insulating layer 186. The forming of the diffusion stop layer 188 may include forming silicon nitride to cover the side surfaces of the first crystalline semiconductor patterns 194*a* and 194*b*, the side surfaces of the plurality of insulating layers 182*a* and 182*b*, and the upper and side surfaces of the upper insulating layer 186 through a deposition process or a sputtering process. Because the diffusion stop layer 188 is formed on the side surfaces of the first crystalline semiconductor patterns 194*a* and 194*b*, the metal included in the first crystalline semiconductor patterns 194*a* and 194*b* may be prevented from penetrating into the first trench TR1.

Figure 14D:
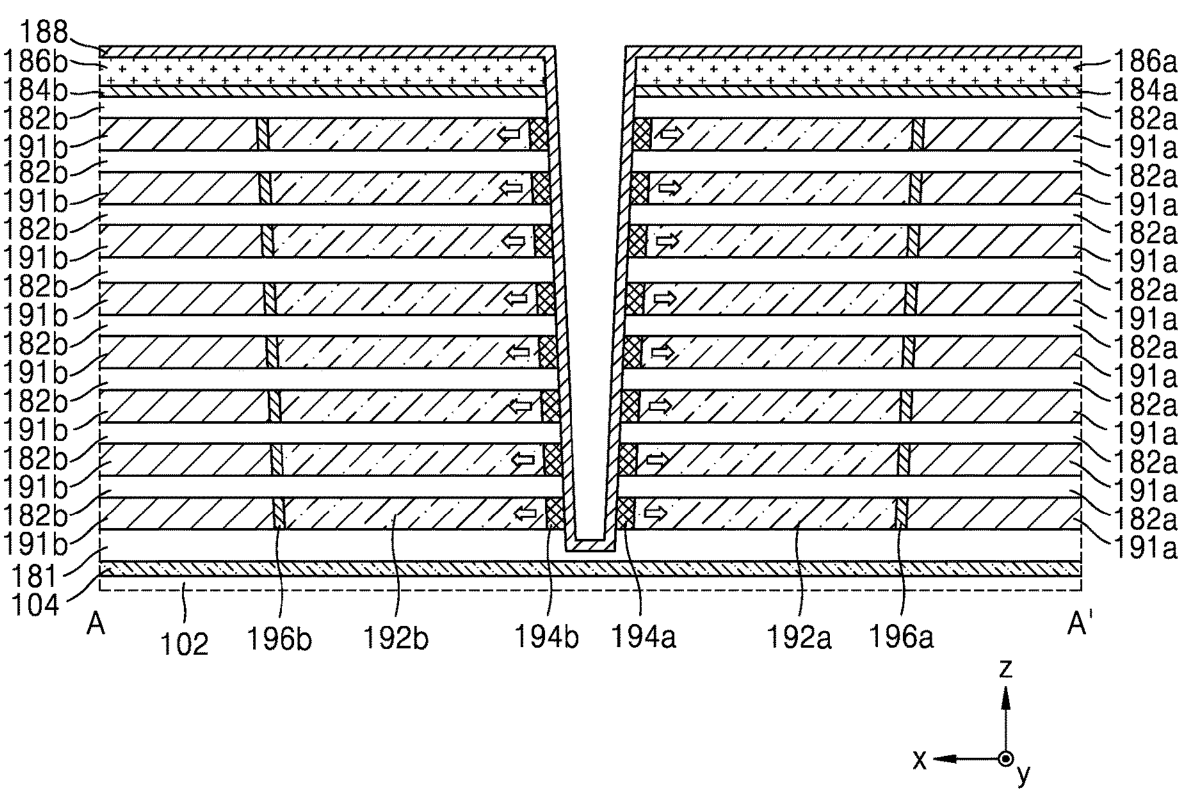

Referring to FIG. 14D, the crystallization method may include crystallizing the channel material layers 191 that are in contact with the first crystalline semiconductor patterns 194*a* and 194*b* into c-Si by performing an annealing process. When the channel material layers 191 are crystallized into c-Si, the horizontal channel layers 192*a* and 192*b* may be formed. The annealing process may be performed at a temperature of about 400° C. to about 650° C. Because the crystallization method shown in FIG. 14D is substantially the same as the crystallization method shown in FIG. 13, redundant descriptions may be omitted or briefly discussed.

Figure 15A:
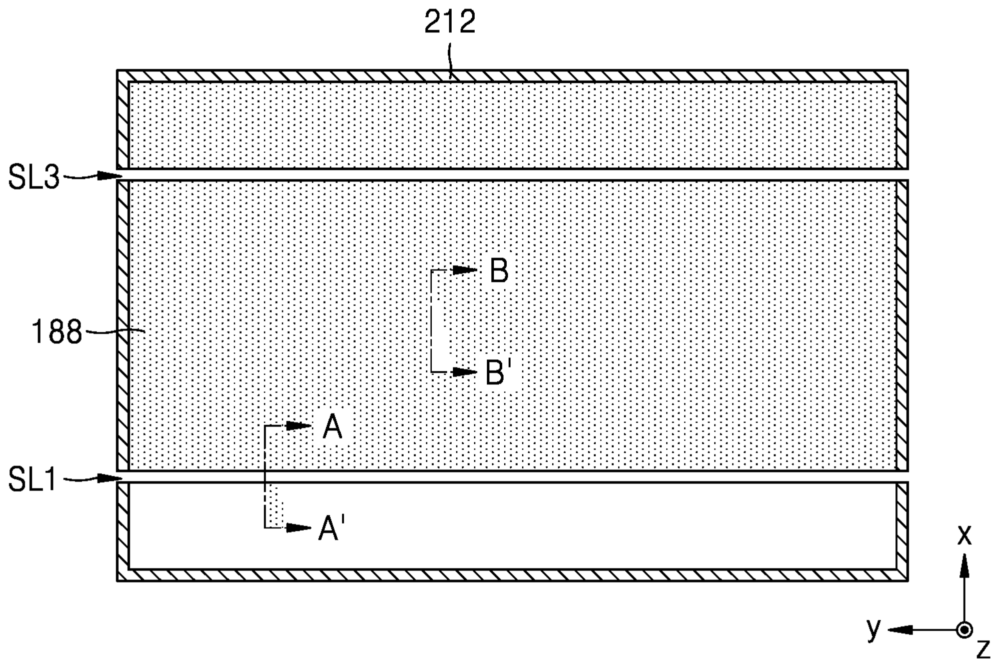
Figure 15B:
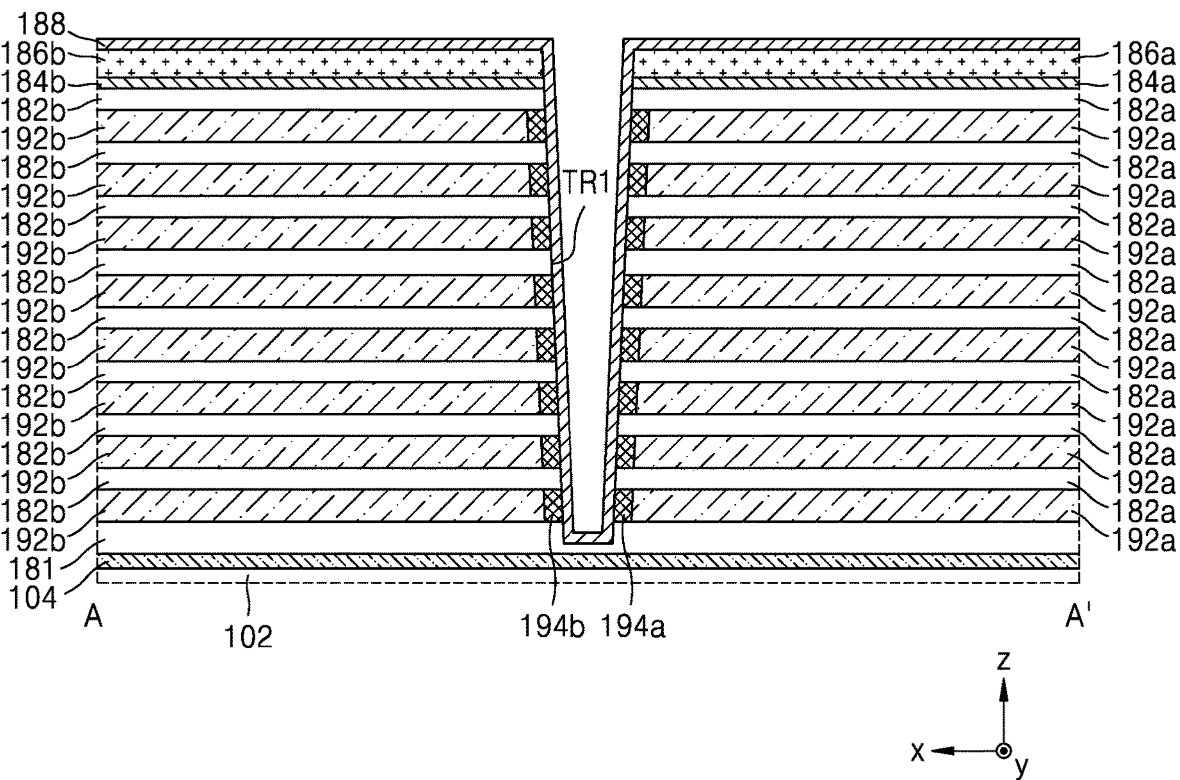
Figure 15C:
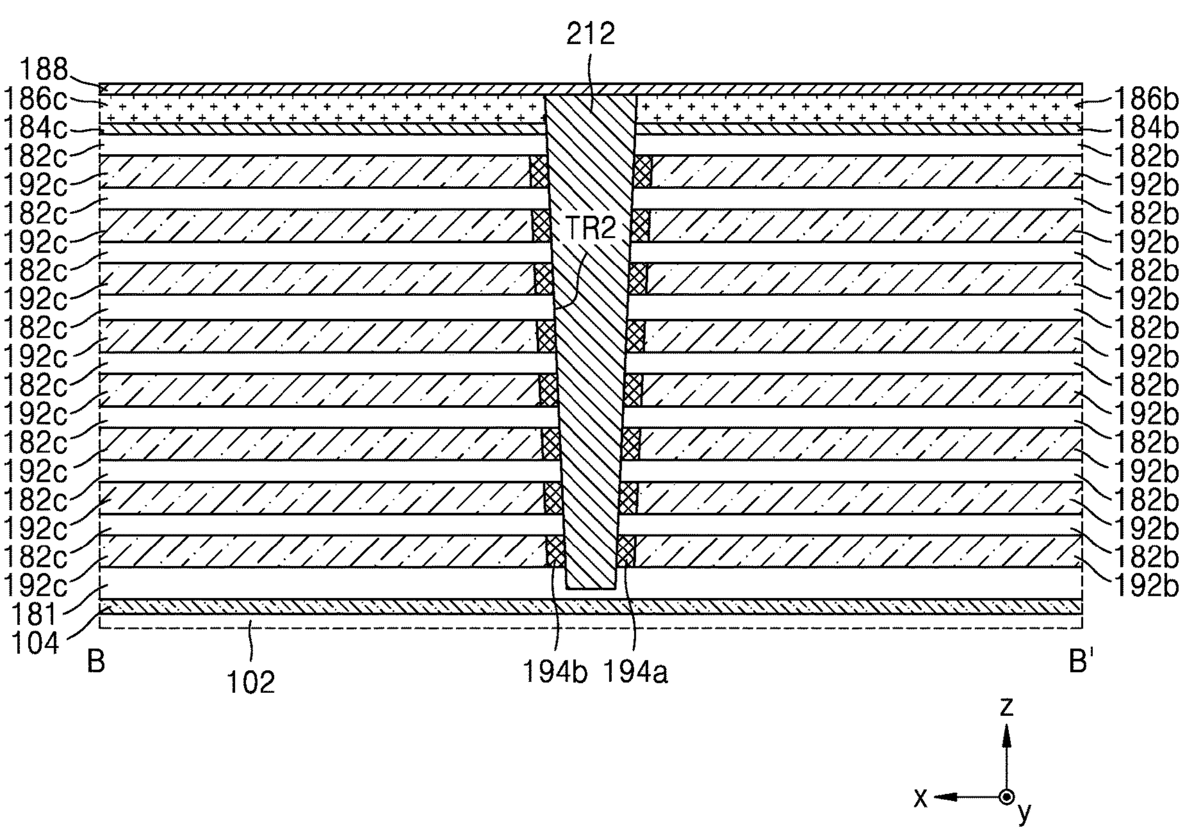

Referring to FIGS. 15A to 15C, when the channel material layers 191 are crystallized, the first crystalline semiconductor patterns 194*a* and 194*b* may be formed to be in contact with side surfaces of the sacrificial layer 212, and the sacrificial layer 212 may be formed in the second trench TR2 between the first crystalline semiconductor patterns 194*a* and 194*b*. For example, as shown in FIG. 15A, the first crystalline semiconductor patterns 194*a* and 194*b* that are crystallized and formed from the vicinity of the first slit SL1 may move in the first horizontal direction (e.g., the X-direction) and reach the vicinity of the second trench TR2.

Figure 16A:
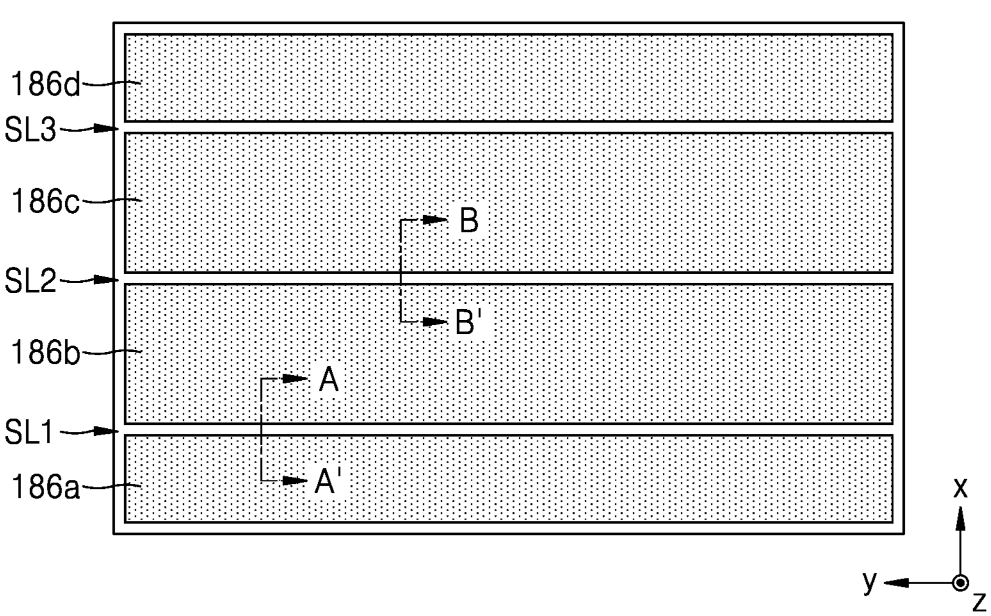
Figure 16B:
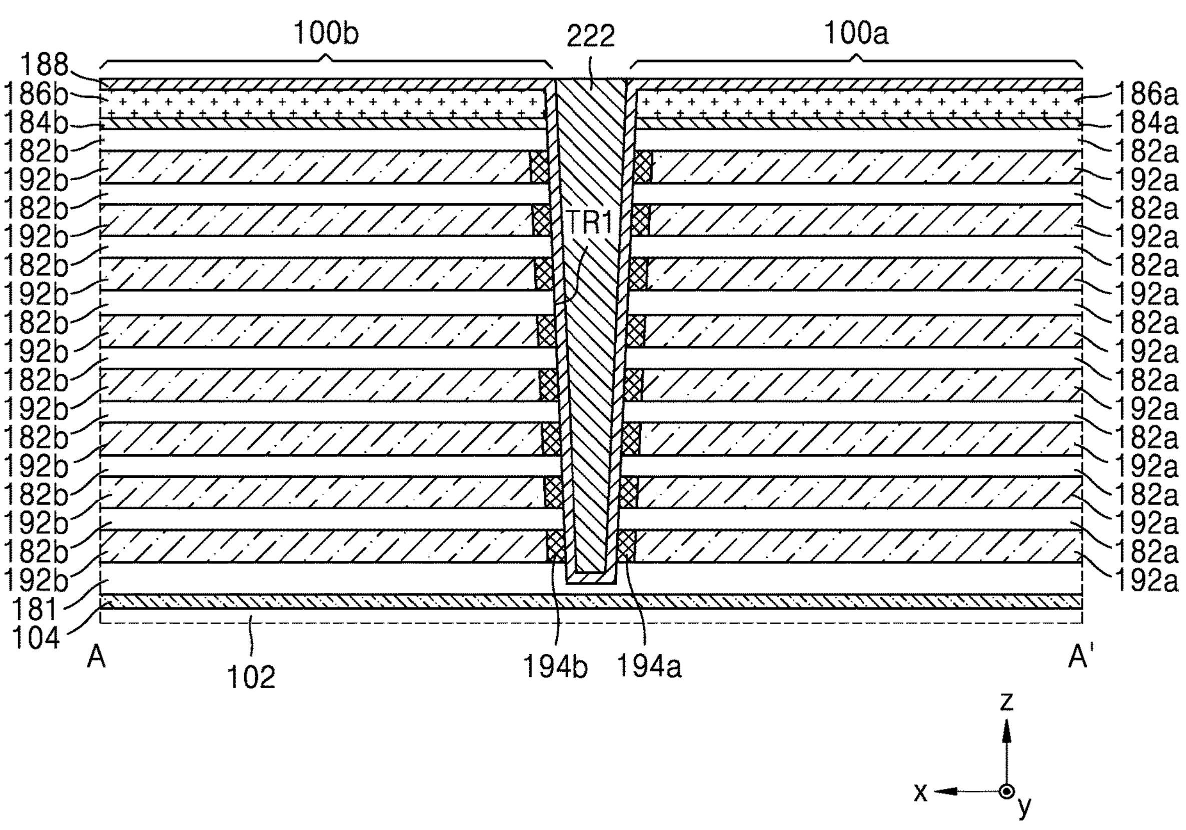
Figure 16C:
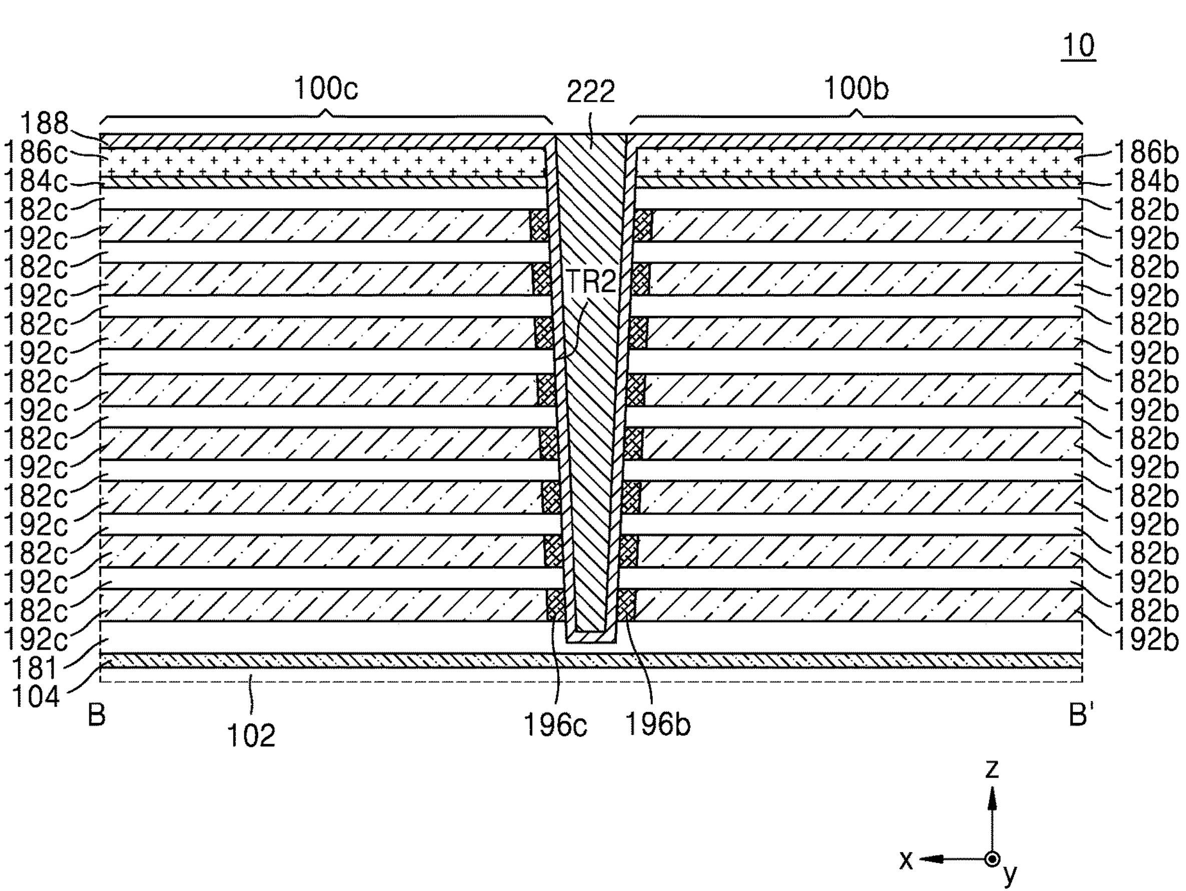

Referring to FIGS. 16A to 16C, the method of manufacturing the three-dimensional nonvolatile memory device 10 according to an embodiment of the present inventive concept may include forming a first slit insulating layer 222*a* filling the first trench TR1. In addition, the method of manufacturing the three-dimensional nonvolatile memory device 10 according to an embodiment of the present inventive concept may include forming the second trench TR2 with the second slit insulating layer 222*b*, after the diffusion stop layer 188 covering the upper surface of the sacrificial layer 212 formed in the second trench TR2, and the sacrificial layer 212 are removed. The forming of the first slit insulating layer 222*a* and the second slit insulating layer 222*b* may include silicon oxide through a deposition process.

Then, the MILC is complete, as shown in FIG. 1, the plurality of memory cell strings 161, 162, 163, 164, and 165 and the bit line pad stacks 131*a* and 131*b* may be formed. As described above, after the MILC is complete, a memory cell structure may be miniaturized by performing patterning.

Figure 17:
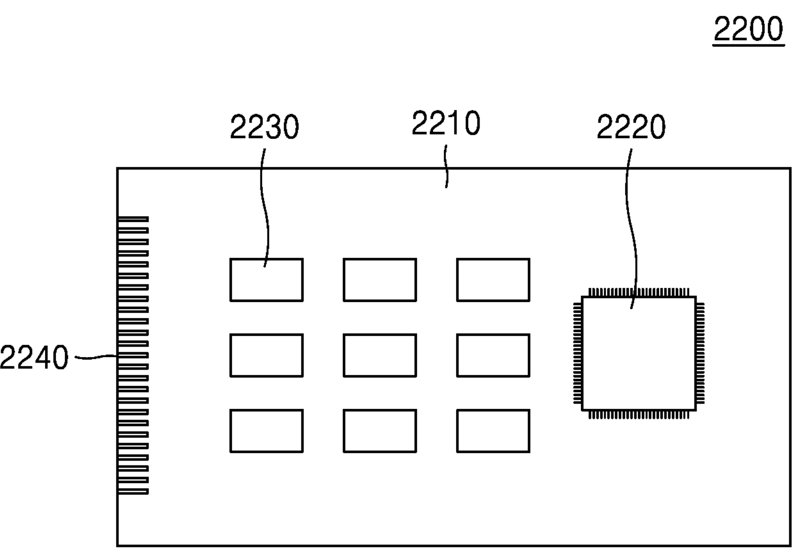
FIG. 17 is a diagram of a semiconductor module including a three-dimensional nonvolatile memory device, according to an embodiment of the present inventive concept.

FIG. 17 is a conceptual diagram of a semiconductor module 2200 including a three-dimensional nonvolatile memory device, according to an embodiment of the present inventive concept.

Referring to FIG. 17, the semiconductor module 2200 according to an embodiment of the present inventive concept may include a processor 2220 and memory devices 2230 mounted on a semiconductor module substrate 2210. The processor 2220 or the memory devices 2230 may include the three-dimensional nonvolatile memory device 10 according to an embodiment of the present inventive concept. Input/output terminals 2240 may be arranged on at least one side of the semiconductor module substrate 2210.

Figure 18:
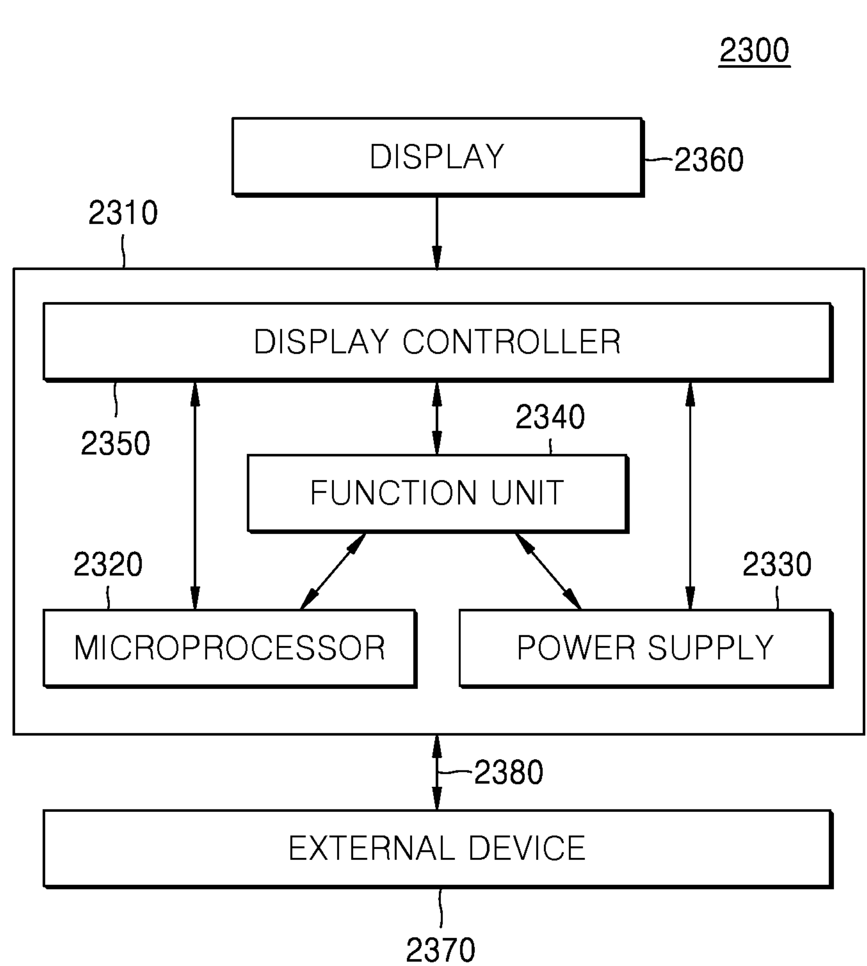
FIGS. 18 and 19 are block diagrams of electronic systems including a three-dimensional nonvolatile memory device, according to an embodiment of the present inventive concept.
Figure 19:
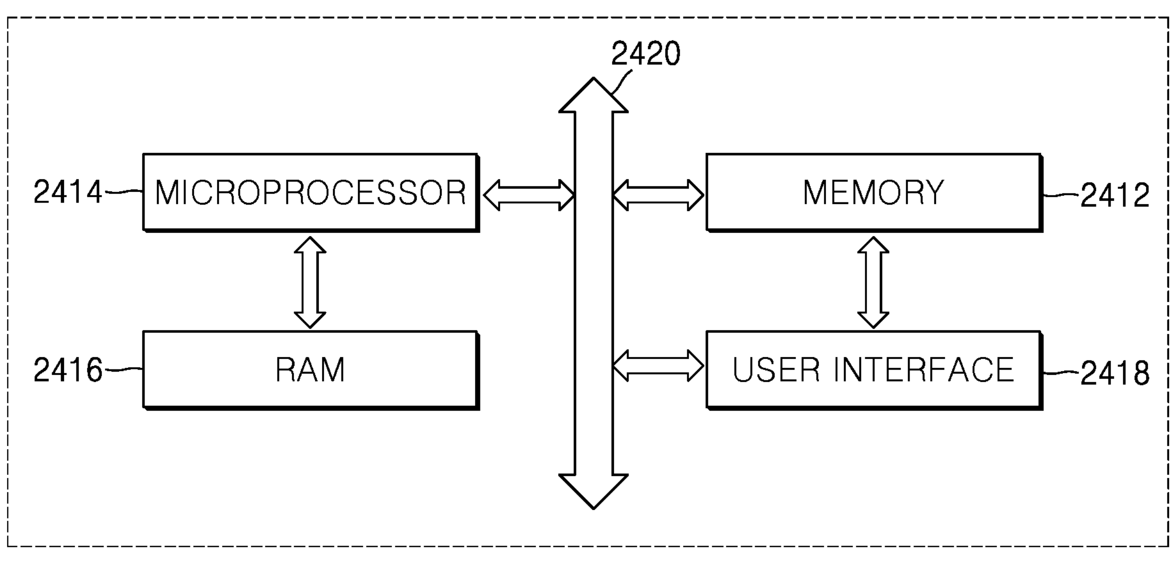

FIGS. 18 and 19 are conceptual block diagrams of electronic systems including the three-dimensional nonvolatile memory device 10, according to an embodiment of the present inventive concept. Referring to FIG. 18, an electronic system 2300 according to an embodiment of the present inventive concept may include a body 2310, a display 2360, and an external device 2370. The body 2310 may include a microprocessor 2320, a power supply 2330, a function unit 2340, and/or a display controller 2350. The body 2310 may include a system board or mother board having a printed circuit board (PCB) or the like, and/or a case. The microprocessor 2320, the power supply 2330, the function unit 2340, and the display controller 2350 may be mounted or arranged on or inside the body 2310. The display 2360 may be arranged on the body 2310 or inside/outside the body 2310. The display 2360 may display an image processed by the display controller 2350. For example, the display 2360 may include a liquid crystal display (LCD), an active matrix organic light emitting diode (AMOLED), or various types of display panels. The display 2360 may include a touch screen. Accordingly, the display 2360 may have an input/output function. The power supply 2330 may supply a current or voltage to the microprocessor 2320, the function unit 2340, the display controller 2350, or the like. The power supply 2330 may include, for example, a rechargeable battery, a battery socket, and/or a voltage/current converter. The microprocessor 2320 may control the function unit 2340 and the display 2360 by receiving the voltage from the power supply 2330. For example, the microprocessor 2320 may include a central processing unit (CPU) or an application processor (AP). The function unit 2340 may perform various functions. For example, the function unit 2340 may include a touch pad, a touch screen, volatile/non-volatile memory, a memory card controller, a camera, a light, a speech and video playback processor, a wireless transmit/receive antenna, a speaker, a microphone, a universal serial bus (USB) port, or units having various other functions. The microprocessor 2320 or the function unit 2340 may include the three-dimensional nonvolatile memory device 10 according to an embodiment of the present inventive concept.

Referring to FIG. 19, an electronic system 2400 according to an embodiment of the present inventive concept may include a microprocessor 2414, a memory 2412, and a user interface 2418, which perform data communication through a bus 2420. The microprocessor 2414 may include a CPU or an AP. The electronic system 2400 may further include a random-access memory (RAM) 2416 in direct communication with the microprocessor 2414. The microprocessor 2414 and/or the RAM 2416 may be assembled into a single package. The user interface 2418 may be used to input information into the electronic system 2400 or output information from the electronic system 2400. For example, the user interface 2418 may include a touch pad, a touch screen, a mouse, a scanner, a speech detector, a cathode array tube (CRT) monitor, an LCD, an AMOLED, a plasma display panel (PDP), a printer, a light, or various other input/output devices. The memory 2412 may store operating codes of the microprocessor 2414, data processed by the microprocessor 2414, or external input data. The memory 2412 may include a memory controller, a hard disk, or a solid state drive (SSD). The microprocessor 2414, the RAM 2416, and/or the memory 2412 may include the three-dimensional nonvolatile memory device 10 according to an embodiment of the present inventive concept.

As described above, the embodiments of the present inventive concept have been disclosed with reference to the drawings. Although the embodiments have been described using specific terms herein, this is only used for the purpose of describing the technical spirit of the present inventive concept and is not used to limit the meaning or scope of the present inventive concept. Therefore, those of ordinary skill in the art will understand that various modifications and other equivalent embodiments may be made therefrom.

While the present inventive concept has been particularly shown and described with reference to example embodiments thereof, it will be apparent to those of ordinary skill in the art that various changes in form and detail may be made thereto without departing from the spirit and scope of the present inventive concept.

What is claimed is:

1. A three-dimensional nonvolatile memory device comprising:

a plurality of insulating layers stacked on a substrate in a vertical direction substantially perpendicular to a main surface of the substrate;

a plurality of channel layers positioned between the plurality of insulating layers, and elongated in a first horizontal direction that is parallel to the main surface of the substrate, wherein the plurality of channel layers includes a first metal element;

a diffusion stop layer conformally formed in a trench passing through the plurality of insulating layers and the plurality of channel layers in the vertical direction; and a crystalline semiconductor pattern between each of the plurality of channel layers and the diffusion stop layer, wherein the crystalline semiconductor pattern includes a second metal element, wherein a concentration of the second metal element in the crystalline semiconductor pattern is higher than a concentration of the first metal element in the plurality of channel layers.

2. The three-dimensional nonvolatile memory device of claim 1, wherein the first metal element and the second metal element are identical elements.

3. The three-dimensional nonvolatile memory device of claim 1, wherein the first metal element and the second metal element each include one of nickel (Ni) or palladium (Pd).

4. The three-dimensional nonvolatile memory device of claim 1, wherein a width of each of the plurality of channel layers in the first horizontal direction is greater than a width of the crystalline semiconductor pattern in the first horizontal direction.

5. The three-dimensional nonvolatile memory device of claim 1, wherein the crystalline semiconductor pattern includes:

a first surface in contact with the diffusion stop layer; and a second surface opposite to the first surface and in contact with each of the plurality of channel layers.

6. The three-dimensional nonvolatile memory device of claim 1, wherein the crystalline semiconductor pattern is a single crystal pattern in a (111) crystal direction.

7. The three-dimensional nonvolatile memory device of claim 1, further comprising a vertical word line structure passing through at least some of the plurality of channel layers in the vertical direction and connected to the plurality of channel layers.

8. A three-dimensional nonvolatile memory device comprising:

a first cell array, a second cell array, and a third cell array each including a plurality of insulating layers and a plurality of channel layers alternately stacked on a substrate in a vertical direction substantially perpendicular to a main surface of the substrate, wherein the first to third cell arrays are spaced apart from each other in a first horizontal direction that is parallel to the main surface of the substrate and crosses the vertical direction;

a diffusion stop layer conformally formed in a first trench between the first cell array and the second cell array, wherein the first trench passes through the plurality of insulating layers and the plurality of channel layers in the vertical direction;

a first slit insulating layer filling the first trench, on the diffusion stop layer; and a first crystalline semiconductor pattern disposed between each of the plurality of channel layers and the diffusion stop layer, wherein the first crystalline semiconductor pattern includes a first metal element, wherein the plurality of channel layers include the first metal element, wherein the first crystalline semiconductor pattern includes a second metal element, wherein a concentration of the second metal element in the first crystalline semiconductor pattern is higher than a concentration of the first metal element in the plurality of channel layers.

9. The three-dimensional nonvolatile memory device of claim 8, wherein a width of the first crystalline semiconductor pattern in a second horizontal direction that crosses the first horizontal direction is greater than a width of the first slit insulating layer in the first horizontal direction.

10. The three-dimensional nonvolatile memory device of claim 8, further comprising a second slit insulating layer filling a second trench, between the second cell array and the third cell array, wherein the second trench passes through the plurality of insulating layers and the plurality of channel layers in the vertical direction.

11. The three-dimensional nonvolatile memory device of claim 10, further comprising a second crystalline semiconductor pattern disposed between each of the plurality of channel layers and the second slit insulating layer, wherein the second crystalline semiconductor pattern includes a third metal element.

12. The three-dimensional nonvolatile memory device of claim 11, wherein the first crystalline semiconductor pattern and the second crystalline semiconductor pattern are each a single crystal pattern in a (111) crystal direction.

13. The three-dimensional nonvolatile memory device of claim 11, wherein a concentration of the third metal element in the second crystalline semiconductor pattern is lower than a concentration of the second metal element in the first crystalline semiconductor pattern.

14. The three-dimensional nonvolatile memory device of claim 11, wherein a concentration of the third metal element in the second crystalline semiconductor pattern is higher than a concentration of the first metal element in the plurality of channel layers.

15. The three-dimensional nonvolatile memory device of claim 11, wherein the first metal element, the second metal element, and the third metal element are identical elements, and each of the first metal element, the second metal element, and the third metal element includes one of nickel (Ni) or palladium (Pd).

16. The three-dimensional nonvolatile memory device of claim 8, wherein the first crystalline semiconductor pattern includes:

a first surface in contact with the diffusion stop layer; and a second surface opposite to the first surface and in contact with each of the plurality of channel layers.

17. The three-dimensional nonvolatile memory device of claim 8, wherein a width of each of the plurality of channel layers in the first horizontal direction is greater than a width of the first crystalline semiconductor pattern in the first horizontal direction.

18. The three-dimensional nonvolatile memory device of claim 8, wherein the first cell array includes a first bit line pad vertically overlapping the plurality of channel layers, the second cell array includes a second bit line pad vertically overlapping the plurality of channel layers, and the diffusion stop layer is disposed between the first bit line pad and the second bit line pad in the first horizontal direction.

19. A three-dimensional nonvolatile memory device comprising:

a first cell array, a second cell array, and a third cell array each including a plurality of insulating layers and a plurality of channel layers alternately stacked on a substrate in a vertical direction substantially perpendicular to a main surface of the substrate, wherein the first to third cell arrays are spaced apart from each other in a first horizontal direction that is parallel to the main surface of the substrate and crosses the vertical direction;

a vertical word line structure passing through some of the plurality of channel layers in the vertical direction and connected to the plurality of channel layers;

a diffusion stop layer conformally formed in a first trench between the first cell array and the second cell array, wherein the first trench passes through the plurality of insulating layers and the plurality of channel layers in the vertical direction;

a first slit insulating layer filling the first trench, on the diffusion stop layer; and a first crystalline semiconductor pattern disposed between each of the plurality of channel layers and the diffusion stop layer, wherein the first crystalline semiconductor pattern includes a first metal element, wherein the plurality of channel layers each include a second metal element, the first metal element and the second metal element are identical elements, and a concentration of the first metal element in the first crystalline semiconductor pattern is higher than a concentration of the second metal element in the plurality of channel layers.

20. The three-dimensional nonvolatile memory device of claim 19, further comprising:

a second slit insulating layer filling a second trench, between the second cell array and the third cell array, wherein the second trench passes through the plurality of insulating layers and the plurality of channel layers in the vertical direction; and a second crystalline semiconductor pattern disposed between each of the plurality of channel layers and the second slit insulating layer, wherein the second crystalline semiconductor pattern includes a third metal element, wherein a concentration of the third metal element in the second crystalline semiconductor pattern is lower than a concentration of the first metal element in the first crystalline semiconductor pattern and higher than a concentration of the second metal element in the plurality of channel layers.

* * * * *